(12) United States Patent
Takizawa et al.

(10) Patent No.: US 8,674,664 B2
(45) Date of Patent: Mar. 18, 2014

(54) CHARGE CONTROLLER

(75) Inventors: Kazuaki Takizawa, Saitama (JP);
Yoshikazu Ohnuma, Saitama (JP);
Mutsuji Suzuki, Saitama (JP);
Yoshihiro Sunaga, Saitama (JP); Naoki Maruno, Saitama (JP); Satoru Komoda, Saitama (JP); Atsushi Shibutani, Saitama (JP); Yoshikazu Nishida, Saitama (JP)

(73) Assignee: Honda Motor Co., Ltd, Tokyo (JP)

( * ) Notice: Subject to any disclaimer, the term of this patent is extended or adjusted under 35 U.S.C. 154(b) by 467 days.

(21) Appl. No.: 13/130,031

(22) PCT Filed: Nov. 20, 2009

(86) PCT No.: PCT/JP2009/069708
§ 371 (c)(1),
(2), (4) Date: May 18, 2011

(87) PCT Pub. No.: WO2010/058839
PCT Pub. Date: May 27, 2010

(65) Prior Publication Data
US 2011/0221400 A1   Sep. 15, 2011

(30) Foreign Application Priority Data

Nov. 21, 2008   (JP) ................................. 2008-298216
Mar. 17, 2009   (JP) ................................. 2009-064381

(51) Int. Cl.
*H02J 7/00* (2006.01)
(52) U.S. Cl.
USPC ........... 320/166; 320/132; 320/152; 320/157; 320/159
(58) Field of Classification Search
CPC ..................................................... H02J 7/345
USPC ....................................................... 320/166
See application file for complete search history.

(56) References Cited

U.S. PATENT DOCUMENTS

2002/0171429 A1   11/2002   Ochiai et al.
2003/0057918 A1   3/2003   Aoki et al.
(Continued)

FOREIGN PATENT DOCUMENTS

JP   11-215731 A   8/1999
JP   2000-125415 A   4/2000
(Continued)

OTHER PUBLICATIONS

Japanese Office Action issued on Jun. 4, 2013.

(Continued)

*Primary Examiner* — Edward Tso
*Assistant Examiner* — Ahmed Omar
(74) *Attorney, Agent, or Firm* — Arent Fox LLP

(57) ABSTRACT

There is provided a charge controller capable of charging a capacitor while suppressing the progress of deterioration of the capacitor without unnecessary charge/discharge of the capacitor.

The charge controller includes a voltage sensor 133 that detects the voltage of a capacitor 101, a current sensor 135 that detects the charge/discharge current of the capacitor 101, a battery ECU 123 that estimates the SOC of the capacitor 101 based on the detected voltage, and a management ECU 117. The management ECU 117 calculates the charge/discharge amount from the start of charging of the capacitor 101 by integrating the charge/discharge currents detected by the current sensor 135 and controls the charging of the capacitor 101 based on the estimated SOC and the calculated charge/discharge amount. The management ECU 117 updates and sets the estimated SOC to an actual use upper limit SOC based on the state characteristics of the capacitor 101.

20 Claims, 28 Drawing Sheets

(56) References Cited

U.S. PATENT DOCUMENTS

| | | | |
|---|---|---|---|
| 2003/0076074 A1* | 4/2003 | Kawai | 320/136 |
| 2006/0152195 A1 | 7/2006 | Ishishita | |
| 2008/0180064 A1 | 7/2008 | Miki et al. | |

FOREIGN PATENT DOCUMENTS

| | | | | |
|---|---|---|---|---|
| JP | 2000-287372 A | 10/2000 | | |
| JP | 2001-157366 | 6/2001 | | |
| JP | 2002-199616 A | 7/2002 | | |
| JP | 2003-92836 A | 3/2003 | | |
| JP | 2003-132955 A | 5/2003 | | |
| JP | 2004-166350 A | 6/2004 | | |
| JP | 2004-271410 A | 9/2004 | | |
| JP | 2005-065352 A | 3/2005 | | |
| JP | 2007-147487 A | 6/2007 | | |
| JP | 2007-323999 A | 12/2007 | | |
| JP | 2007323999 | * 12/2007 | | H01M 10/48 |
| JP | 2008-087516 A | 4/2008 | | |
| JP | 2008-170196 A | 7/2008 | | |

OTHER PUBLICATIONS

Japanese Office Action 2009-064381 issued on Aug. 21, 2012.
Japanese Office Action from JP 2008-298216 dated May 8, 2012.

* cited by examiner

CHARGE CONTROLLER

CROSS-REFERENCE TO RELATED APPLICATION

This application is a National Stage entry of International Application No. PCT/JP2009/069708, having an international filing date of Nov. 20, 2009; which claims priority to Japanese Application Nos.: 2008-298216, filed Nov. 21, 2008 and 2009-064381, filed Mar. 17, 2009, the disclosure of each of which is hereby incorporated in its entirety by reference.

TECHNICAL FIELD

The present invention relates to a charge controller of a chargeable capacitor.

BACKGROUND ART

In vehicles such as an EV (Electric Vehicle) and an HEV (Hybrid Electrical Vehicle), a capacitor that supplies electric power to a motor and the like is mounted. In the capacitor mounted in the vehicles, a battery such as a lithium ion battery, a nickel hydride battery is mounted.

In a case where a lithium ion battery is used as the capacitor, when the capacitor is left uncontrolled with being mounted in the vehicle for a long time or when the capacitor is used over a long time, deterioration of the capacitor occurs. The deterioration of the capacitor, as illustrated in FIG. 27, can easily occur when the charge state (SOC: State of Charge, this is a rated value of the remaining capacity of the capacitor with a fully-charged state and a completely-discharged state being set to 100(%) and 0(%)) of the capacitor is high. FIG. 27 is a diagram illustrating an example of the relationship between the duration days (used days) and the capacity decreasing rate of a capacitor. In other words, when the capacitor is used or left uncontrolled in a high SOC state, the decreasing rate of the capacity increases, and accordingly, the deterioration of the capacitor may easily progress.

Similarly, in the state in which the capacitor is in the high SOC state, a usable capacity decreases due to the deterioration of the capacity of the capacitor. The usable capacity is a difference between usable an upper limit SOC (hereinafter, also referred to as a boundary upper limit SOC) and a usable lower limit SOC (hereinafter, also referred to as a usable lower limit SOC). FIG. 28 is a diagram illustrating the relationship between the usage period and the usable capacity of a conventional battery.

As an example of the method for preventing the deterioration of the battery, in order to prevent the battery from being left uncontrolled in the high SOC, a technology of discharging a battery using an externally-connected device or a technology of charging a battery using a timer before the use of the vehicle is known (for example, see Patent Document 1). In addition, a technology of discharging a battery before the lithium ion secondary battery is left uncontrolled for a long time in a charged state at high temperature is known (for example, see Patent Document 2).

In addition, in a case where the deterioration of the capacitor occurs, a technology of decreasing the boundary upper limit SOC of the battery in accordance with the state of deterioration of the battery, prohibiting idling or limiting accessory driving is known (for example, see Patent Document 3). In addition, a technology of controlling the SOC so as to maximize the vehicle output in accordance with the state of deterioration of the battery is known (for example, see Patent Document 4).

RELATED ARTS

Patent Document

Patent Document 1: JP-A-2002-199616
Patent Document 2: JP-A-2000-287372
Patent Document 3: JP-A-2007-323999
Patent Document 4: JP-A-2000-125415

SUMMARY OF THE INVENTION

Problem that the Invention is to Solve

However, according to the technology disclosed in Patent Documents 1 and 2, in order to acquire a desired charged amount at the time of use by avoiding to leave the battery uncontrolled in the high SOC state, the charging and the discharging of the capacitor needs to be repeated.

In addition, a conventional capacitor is not particularly limited between the usable lower limit SOC and the boundary upper limit SOC as the range of the usable SOC from the initial period to the final period of the use thereof. According to energy management in which the usable SOC area is used as the entire area through the usage period of the capacitor, there is a possibility that the vehicle is left uncontrolled or used in the high SOC area in a relatively initial period of the use. As a result, the deterioration of the capacitor progresses, and the ratio of the motor driving decreases due to a decrease in the distance at which the motor driving can be performed, a decrease in the time for assistance or regeneration, or the like, whereby there is a case where a user gets a feeling of strangeness during driving. In addition, by only stopping the vehicle, the deterioration of the capacitor is promoted, and there is a case where the vehicle cannot be driven due to the deterioration of the capacitor even in a case where the driving distance is short.

Furthermore, according to the technology disclosed in Patent Document 3, the usable capacity of the battery is changed in accordance with the estimated state of deterioration. However, when the range of the usable capacity is decreased so as to suppress the deterioration of the battery, there is a case where the behavior of the vehicle is affected such as a decrease in the distance for motor driving or a decrease in the usable range of the motor device.

In addition, according to the technology disclosed in Patent Document 4, since the usable capacity of the battery and the vehicle output are controlled to be maximized, the deterioration of the battery is promoted, and there is a case where the vehicle driving performance is affected.

The present invention is made in view of the above-described problems, and it is an object of the present invention to provide a charge controller capable of charging a capacitor while suppressing the deterioration of the capacitor without performing unnecessary charging and discharging of the capacitor.

In addition, it is an object of the present invention to provide a charge controller capable of charging a capacitor while suppressing the progress of the deterioration of the capacitor with the demanded output of the vehicle being satisfied.

In order to achieve the object of the present invention by solving the above-described problem, a charge controller of the invention described in claim 1 is a charge controller for a chargeable capacitor (e.g., a capacitor 101 according to an embodiment). The charge controller includes: a voltage detector (e.g., a voltage sensor 133 of an embodiment) that detects a voltage of the capacitor; a current detector (e.g., a current detector 135 of an embodiment) that detects a charge/ discharge current of the capacitor; a charge capacity estimating unit (e.g., a battery ECU 123) that estimates a charge capacity (e.g., an SOC of an embodiment) of the capacitor based on the voltage detected by the voltage detector; a charge/discharge amount calculator (e.g., a management ECU 117 of an embodiment) that calculates a charge/discharge amount of the capacitor from start of charging the capacitor by integrating the charge/discharge current detected by the current detector; and a charge controller (e.g., a management ECU 117 of an embodiment) that controls charging of the capacitor based on the charge capacity of the capacitor that is estimated by the charge capacity estimating unit and the charge/discharge amount of the capacitor that is calculated by the charge/discharge amount calculator. The charge controller updates and sets the charge capacity estimated by the charge capacity estimating unit to actual use upper limit charge capacity (e.g., an actual use upper limit SOC of an embodiment) based on a state characteristic of the capacitor.

According to the charge controller of the invention described in claim 2, the charge controller updates and sets the charge capacity estimated by the charge capacity estimating unit to the actual use upper limit charge capacity at the time of a state characteristic in which the charge/discharge amount calculated by the charge/discharge amount calculator reaches a predetermined value in charging the capacitor.

According to the charge controller of the invention described in claim 3, the charge controller performs a first charge mode in which the charge capacity, which is estimated by the charge capacity estimating unit, at a time when the charge/discharge amount calculated by the charge/discharge amount calculator reaches the predetermined value from a time when the charge capacity estimated by the charge capacity estimating unit is a usable lower limit charge capacity is set as the actual use upper limit charge capacity in charging the capacitor.

According to the charge controller of the invention described in claim 4, the charge controller performs the charging of the capacitor until the charge/discharge amount calculated by the charge/discharge amount calculator reaches a predetermined value even if the charge capacity estimated by the charge capacity estimating unit reaches the actual use upper limit charge capacity.

According to the charge controller of the invention described in claim 5, the charge controller controls the charging of the capacitor to be stopped when the charge capacity estimated by the charge capacity estimating unit does not reach the actual use upper limit charge capacity but the charge/discharge amount calculated by the charge/discharge amount calculator reaches a predetermined value.

The charge controller of the invention described in claim 6, further includes: a memory unit (e.g., a memory unit of an embodiment) that stores therein the charge capacity estimated by the charge capacity estimating unit whenever the charge/discharge amount reaches a predetermined value. The charge controller sets the actual use upper limit charge capacity based on the charge capacity stored in the memory unit.

According to the charge controller of the invention described in claim 7, the memory unit stores therein the estimated charge capacity corresponding a predetermined number whenever the charge/discharge amount reaches the predetermined value.

According to the charge controller of the invention described in claim 8, the memory unit stores therein the estimated charge capacity corresponding to a predetermined number whenever the charge/discharge amount reaches the predetermined value during a predetermined time interval.

According to the charge controller of the invention described in claim 9, the charge controller performs a second charge mode when the charging of the capacitor is started such that the charge capacity estimated by the charge capacity estimating unit is higher than a usable lower limit charge capacity. In the second charge mode, the charge controller estimates a remaining amount of the capacitor at the time of starting the charging based on the actual use upper limit charge capacity, the usable lower limit charge capacity, the charge capacity estimated by the charge capacity estimating unit, and the predetermined value at the time of the starting of the charging, and the charge controller includes the remaining amount in the charge/discharge amount in charging the capacitor.

According to the charge controller of the invention described in claim 10, the second charge mode is performed when the capacitor is connected to an external power source provided outside a vehicle in which the capacitor is mounted. The remaining amount is estimated as $(X-C)/(B-C) \times A$, where the actual use upper limit charge capacity is B, the usable lower limit charge capacity is C, the charge capacity estimated by the charge capacity estimating unit is X, and the predetermined value is A at the time of connecting the capacitor to the external power source.

According to the charge controller of the invention described in claim 11, a boundary upper limit charge capacity is initialized, and the charge controller estimates a malfunction in the capacitor and notifies a notification unit of an indication thereof if the actual use upper limit charge capacity exceeds the boundary upper limit charge capacity.

The charge controller of the invention described in claim 12, further includes: an internal resistance estimating unit (e.g., a battery ECU 123 of an embodiment) that estimates internal resistance of the capacitor. The charge controller, based on the state characteristic according to the internal resistance estimated by the internal resistance estimating unit, sets a value that is larger than the usable lower limit charge capacity (e.g., an usable lower limit charge capacity SOC of an embodiment) of the capacitor and equal to or less than the boundary upper limit charge capacity (e.g., a boundary upper limit SOC of an embodiment) and satisfies a demanded output of a vehicle (e.g., a vehicle of an embodiment) in which the capacitor is mounted, as the actual use lower limit charge capacity (e.g., an actual use lower limit SOC of an embodiment) and performs the charging of the capacitor while maintaining the charge capacity to be equal to or higher than the actual use lower limit charge capacity.

According to the charge controller of the invention described in claim 13, the charge controller sets a value that is larger than the actual use lower limit charge capacity of the capacitor and is equal to or less than the boundary upper limit charge capacity, as an actual use upper limit charge capacity (e.g., an actual use upper limit SOC of an embodiment), and performs the charging of the capacitor between the actual use lower limit charge capacity and the actual use upper limit charge capacity.

According to the charge controller of the invention described in claim 14, the charge controller, when a maximum output when the charge capacity of the capacitor is the actual use lower limit charge capacity is different from the demanded output of the vehicle, updates the actual use lower limit charge capacity with the charge capacity at which the demanded output of the vehicle is the maximum output.

According to the charge controller of the invention described in claim 15, the charge controller, when the maximum output at the time when the charge capacity of the capacitor is the actual use lower limit charge capacity does not satisfy the demanded output of the vehicle, updates the actual use lower limit charge capacity with the charge capacity at which the demanded output of the vehicle is the maximum output.

According to the charge controller of the invention described in claim 16, the charge controller, when the maximum output at the time when the charge capacity of the capacitor is the actual use lower limit charge capacity is higher than the demanded output of the vehicle, updates the actual use lower limit charge capacity with the charge capacity at which the demanded output of the vehicle is the maximum output.

The charge controller of the invention described in claim 17, further includes: a memory unit that stores therein first information (e.g., an SOC-OCV table of an embodiment) that associates the charge capacity of the capacitor with an open-circuit voltage of the capacitor. The charge controller estimates the open-circuit voltage of the capacitor at a time when the charge capacity of the capacitor is the actual use lower limit charge capacity based on the first information stored in the memory unit and updates the actual use lower limit charge capacity based on an actual arrival voltage that represents a dropped voltage at a time when the capacitor performs output corresponding to the demanded output of the vehicle and a predicted arrival voltage that represents a difference between the estimated open-circuit voltage and a predetermined protection lower limit voltage that is used for protecting the capacitor.

The charge controller of the invention described in claim 18, further includes: a temperature detector (e.g., a temperature sensor 131 of an embodiment) that detects temperature of the capacitor, wherein the charge controller updates the actual use lower limit charge capacity based on the temperature detected by the temperature detector.

According to the charge controller of the invention described in claim 19, the charge controller updates the actual use upper limit charge capacity based on an update amount of the actual use lower limit charge capacity.

The charge controller of the invention described in claim 20, further includes: a memory unit that stores therein second information (e.g., an actual use upper limit SOC—an actual use lower SOC table of an embodiment) associating the actual use lower limit charge capacity with the actual use upper limit charge capacity. The charge controller refers to the second information that is stored in the memory unit and updates the actual use lower limit charge capacity based on the update amount of the actual use upper limit charge capacity.

Advantage of the Invention

According to the charge controller of the invention described in claim 1, it is possible to charge a capacitor without performing unnecessary charging and discharging of the capacitor while suppressing the progress of the deterioration of the capacitor.

According to the charge controller of the invention described in claim 2, it is possible to charge a capacitor without performing unnecessary charging and discharging of the capacitor while suppressing the progress of the deterioration of the capacitor. In addition, the actual use upper limit charge capacity for which a capacity amount optimal to the capacitor can be charged can be set.

According to the charge controller of the invention described in claim 3, it is possible to set the actual use upper limit charge capacity for which a charge amount optimal to the capacitor can be set, for example, during the driving of the vehicle.

According to the charge controller of the invention described in claim 4, it is possible to maintain the actual capacity of the capacitor to be constant by updating the actual use upper limit in the increasing direction even in a case where the actual capacity (the actual use upper limit charge capacity—the usable lower limit charge capacity) of the capacitor decreases due to the deterioration or the like of the capacitor. In addition, since the actual capacity of the capacitor is constant, there is no case where a user gets a feeling of strangeness.

According to the charge controller of the invention described in claim 5, it is possible to prevent the promotion of deterioration of the capacitor by updating the actual use upper limit charge capacity in the decreasing direction even in a case where the actual use upper limit charge capacity is set to be too large through updates.

According to the charge controller of the invention described in claim 6, since the actual use upper limit charge capacity is updated from a plurality of candidates used for updating the actual use upper limit charge capacity, an actual use upper limit charge capacity that is optimal can be set.

According to the charge controller of the invention described in claim 7, since the actual use upper limit charge capacity is updated from candidates of a predetermined number, an actual use upper limit charge capacity that is optimal can be set.

According to the charge controller of the invention described in claim 8, it is possible to set an optimal actual use upper limit charge capacity from a plurality of candidates within a predetermined time.

According to the charge controller of the invention described in claim 9, it is possible to perform charging in consideration of the remaining amount of the capacitor at the time of starting of the charging by starting the charging at a timing other than a timing at which the usable lower limit charge capacity is used as a trigger.

According to the charge controller of the invention described in claim 10, it is possible to perform charging also through plug charging, in which charging of the capacitor is performed from an external power supply source, without performing unnecessary charging and discharging of the capacitor while suppressing the promotion of deterioration of the capacitor, similarly to the charging through an electrical generator or the like disposed inside the vehicle.

According to the charge controller of the invention described in claim 11, it is possible to notify a user using the vehicle of a warning even in a case where the capacitor deteriorates more than considered, and accordingly, urging to exchange the capacitor or the like can be performed.

According to the charge controller of the invention described in claim 12, it is possible to charge the capacitor while satisfying the demanded output of the vehicle. In addition, a state can be maintained in which the motor driving can be performed without any problem while saving the electric power.

According to the charge controller of the invention described in claim 13, charging is performed between the actual use lower limit charge capacity and the actual use upper limit charge capacity, and accordingly, it is possible to charge the capacitor while satisfying the demanded output of the vehicle and suppressing the progress of deterioration of the capacitor.

According to the charge controller of the invention described in claim 14, since the charge capacity of the capacitor can be maintained at the lower limit capacity satisfying the demanded output of the vehicle, and accordingly, it is possible to charge the capacitor while satisfying the demanded output of the vehicle and suppressing the progress of deterioration of the capacitor.

According to the charge controller of the invention described in claim 15, since the actual use lower limit charge capacity can be updated in the increasing direction so as to maintain the charge capacity of the capacitor at the lower limit capacity satisfying the demanded output of the vehicle, it is possible to charge the capacitor while satisfying the demanded output of the vehicle and suppressing the progress of deterioration of the capacitor.

According to the charge controller of the invention described in claim 16, since the actual use lower limit charge capacity can be updated in the decreasing direction so as to maintain the capacity of the capacitor at the lower limit charge capacity satisfying the demanded output of the vehicle, it is possible to charge the capacitor while satisfying the demanded output of the vehicle and suppressing the progress of deterioration of the capacitor.

According to the charge controller of the invention described in claim 17, the SOC-OCV table in which the charge capacity of the capacitor is associated with the open-circuit voltage is included, and the actual use lower limit charge capacity is updated based on a result of comparison between the actual dropped voltage at the time of performing the demanded output of the vehicle and a desired dropped voltage, whereby the actual use lower limit charge capacity can be reliably updated with a value satisfying the demanded output of the vehicle.

According to the charge controller of the invention described in claim 18, charging that satisfies the demanded output of the vehicle can be performed even in a case where the output changes in accordance with the change in the temperature of the capacitor.

According to the charge controller of the invention described in claim 19, by also updating the actual use upper limit charge capacity corresponding to the update amount (the raise amount or the dropped amount) of the actual use lower limit charge capacity, the usable capacity can be maintained to be constant all the time. Accordingly, the deterioration of the capacitor is suppressed, and the motor driving ratio is maintained to be the same as that of a new product even in a case where the battery capacity is small, whereby there is no case where a user gets a feeling of strangeness.

According to the charge controller of the invention described in claim 20, by also updating the actual use lower limit charge capacity corresponding to the update amount (the raise amount or the dropped amount) of the actual use upper limit charge capacity, the usable capacity can be maintained to be constant all the time. Accordingly, the deterioration of the capacitor is suppressed, and the motor driving ratio is maintained to be the same as that of a new product even in a case where the battery capacity is small, whereby there is no case where a user gets a feeling of strangeness. In addition, also in this case, the demanded output of the vehicle can be satisfied.

BEST MODE FOR CARRYING OUT THE INVENTION

First Embodiment

A charge controller according to a first embodiment of the present invention will be described below with reference to drawings.

An HEV (Hybrid Electrical Vehicle) includes an electric motor and an internal combustion engine and is driven by the driving forces of the electric motor and/or the internal combustion engine in accordance with the driving state of the vehicle. The HEV can be broadly classified into two types including a serial type and a parallel type. The serial-type HEV is driven by the driving force of the electric motor that uses a capacitor as a power source. The internal combustion engine is used only for generating electric power, and the electric power generated by the driving force of the internal combustion engine is charged in a capacitor or is supplied to the electric motor. On the other hand, the parallel-type HEV is driven by one or both of the electric motor and the internal combustion engine. In addition, a serial-parallel type HEV that combines both types is also known.

Hereinafter, the serial-type HEV will be described representatively. However, the present invention can be also applied to an HEV of a different type.

Figure 1:
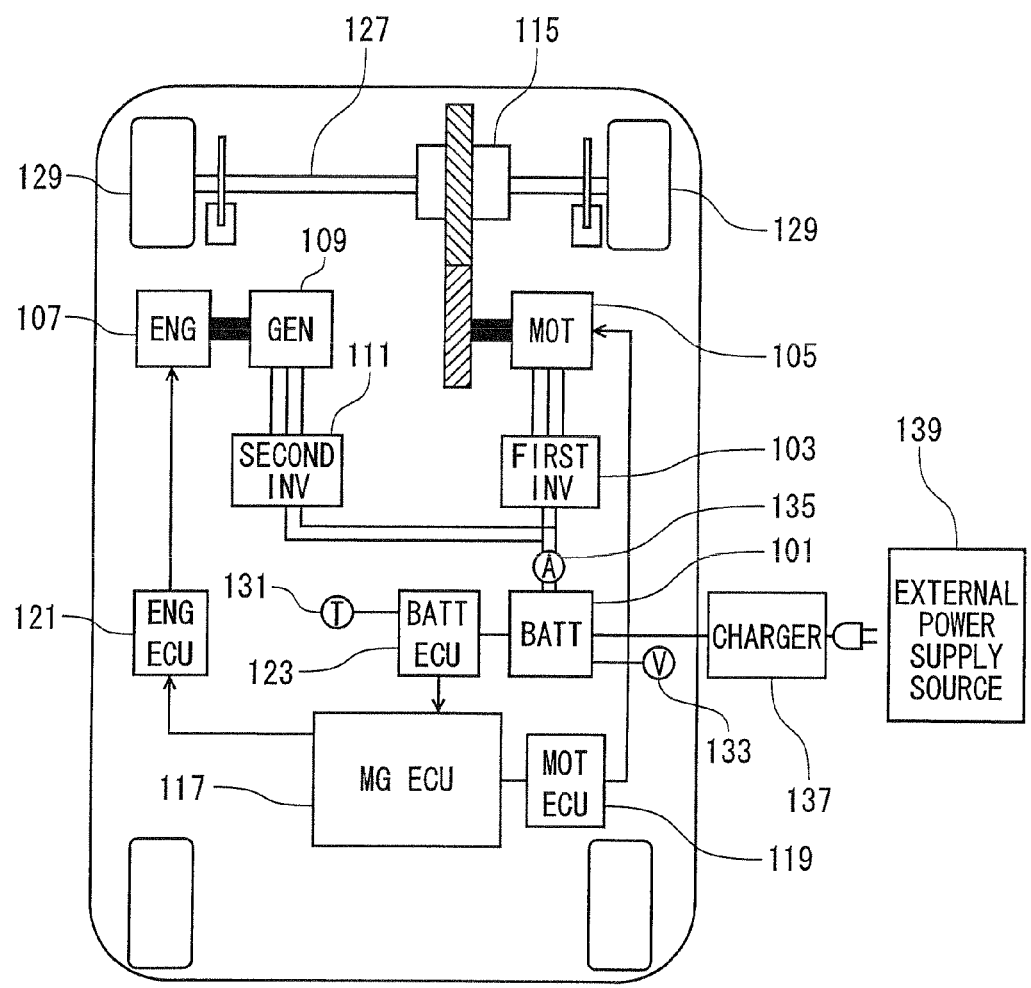
FIG. 1 is a block diagram illustrating an example of the internal configuration of a vehicle according to a first embodiment of the present invention.

FIG. 1 is a block diagram illustrating the internal configuration of a serial-type HEV. In the series-type HEV (hereinafter, briefly referred to as a "vehicle") illustrated in FIG. 1, a driving force generated by an electric motor 105 that uses a capacitor 101 as a power source is delivered to drive wheels 129 through a gear box (gear) 115.

In addition, the driving form of this vehicle is "EV driving" or "serial driving". During the EV driving, the vehicle is driven by the driving force of the electric motor (MOT) 105 that is driven by the supply of power from the capacitor (BATT) 101. On the other hand, during the serial driving, the vehicle is driven by the driving force of the electric motor 105 that is driven by the supply of electric power generated by the electrical generator (GEN) 109 in accordance with the supply of power from the capacitor 101 and the driving of the internal combustion engine 107.

The vehicle illustrated in FIG. 1 includes the capacitor (BATT) 101, a first inverter (first INV) 103, the electric motor (MOT) 105, the multi-cylinder internal combustion engine (ENG) 107, the electrical generator (GEN) 109, a second inverter (second INV) 111, a gear box (hereinafter, briefly referred to as a "gear") 115, a management ECU (MG ECU) 117, a motor ECU (MOT ECU) 119, an engine ECU (ENG ECU) 121, and a battery ECU (BATT ECU) 123.

The capacitor 101 has a plurality of charge cells connected in series and supplies a high-level voltage, for example, of 100 to 200 V, and a battery such as a lithium ion battery is built therein. In addition, the full charging capacity of the capacitor 101 differs in accordance with the degree of deterioration caused by long-term use or the like even at the same SOC.

The first inverter 103 converts a DC voltage supplied from the capacitor 101 into an AC voltage and supplies a three-phase current to the electric motor 105. The electric motor 105 generates power (torque) that is used for driving the vehicle. The torque that is generated by the electric motor 105 is delivered to a drive shaft 127 of the drive wheels 129 through the gear 115.

The multi-cylinder internal combustion engine (hereinafter, briefly referred to as an "internal combustion engine") 107 generates power (torque), and the power is consumed by the electrical generator 109. The electrical generator 109 is directly connected to the internal combustion engine 107.

The electrical generator 109 generates electric power by being driven by the internal combustion engine 107. The electric power generated by the electrical generator 109 is charged in the capacitor 101 or is supplied to the electric motor 105. The second inverter 111 converts an AC voltage generated by the electrical generator 109 into a DC voltage. The electric power converted by the second inverter 111 is charged in the capacitor 101 or is supplied to the electric motor 105 through the first inverter 103.

The gear 115 is a transmission that converts the driving force delivered from the electric motor 105 into a force with the number of revolutions and torque at a desired transmission gear ratio and transfers the converted force to the drive shaft 127. In addition, the gear 115 and the rotor of the electric motor 105 are directly connected to each other.

The management ECU 117 performs switching between the EV driving and the serial driving and controls the electric motor 105 and the internal combustion engine 107 and the like. In addition, to the management ECU 117, information transmitted from a vehicle speed sensor (not shown in the figure) that detects the speed of the vehicle and information transmitted from a demanded driving force sensor (not shown in the figure) that detects the driving force of the vehicle, which is demanded by an accelerator opening driver or the like, are input. The management ECU 117 calculates at least one of the charge amount of the capacitor 101 and the discharge amount of the capacitor 101 (hereinafter, referred to as a charge/discharge amount) and controls the charge state (SOC: State of Charge) of the capacitor 101, which will be described later in detail. Here, the charge/discharge amount is the amount of energy.

A motor ECU 119 controls the electric motor 105 in accordance with an instruction transmitted from the management ECU 117. In addition, the motor ECU 119 controls a current that is supplied from the capacitor 101 to the electric motor 105 when the vehicle speed is instructed to be limited from the management ECU 117. The engine ECU 121 controls the start or the stop of the internal combustion engine 107, opening/closing of a throttle valve of each cylinder and fuel injection, and the number of revolutions of the crankshaft of the internal combustion engine 107 in accordance with an instruction transmitted from the management ECU 117.

A temperature sensor 131 detects the temperature of the capacitor 101. In addition, a voltage sensor 133 detects the voltage applied between the terminals of the capacitor 101. A current sensor 135 detects at least one (hereinafter, referred to as a charge/discharge current) of a charge current flowing into the capacitor 101 and a discharge current flowing out of the capacitor 101. Such detection can be performed, for example, on a regular basis, and the detection timing can be set in a flexible manner.

A charger 137 receives power supply from an external power supply source 139 disposed outside the vehicle and converts an AC voltage into a DC voltage.

The external power supply source 139 is arranged at a charging station or inside a house and supplies electric power to the charger 137 so as to supply electric power having an AC voltage to a vehicle.

Figure 2:
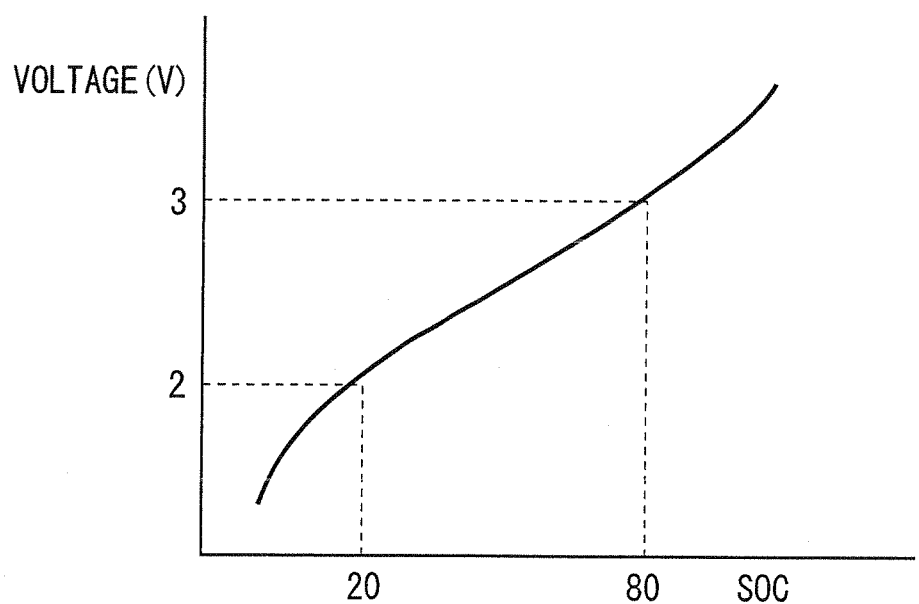
FIG. 2 is a diagram illustrating an example of the relationship between the voltage and the SOC.

The battery ECU 123 estimates the charge state (SOC) of the capacitor 101 and transmits information indicating the state to the management ECU 117. At this time, the battery ECU 123 estimates the SOC of the capacitor 101 through real-time calculation that is based on the voltage detected by the voltage sensor 133. Hereinafter, the estimated SOC of the capacitor 101 is also referred to as an estimated SOC. Since there is a correlation between the SOC and the voltage of the capacitor 101, such an estimation can be attained. FIG. 2 is a diagram illustrating an example of the relationship between the voltage and the SOC. In addition, the SOC may be estimated based on the current detected by the current sensor 135 or the temperature detected by the temperature sensor 131. For example, the SOC may be estimated by correcting the detected voltage based on the detected current or the detected temperature.

In addition, the management ECU 117 calculates at least one (hereinafter, referred to as a charge/discharge amount) of the charge amount of the capacitor 101 and the discharge amount of the capacitor 101 by integrating the charge/discharge current detected by the current sensor 135 at every predetermined period. This calculation method is called a current integration method. For example, the management ECU 117 calculates the charge/discharge amount that is integrated from the start of charging.

Next, the SOC control of the capacitor 101 that is performed by the management ECU 117 will be described.

In this embodiment, a boundary upper limit SOC and a usable lower limit SOC are set in advance. The management ECU 117 sets an actual use upper limit SOC between them and charges the capacitor 101 between the usable lower limit SOC and the actual use upper limit SOC based on the above-described estimated SOC and the above-described charge/discharge amount. Here, the actual use upper limit SOC is a variable value, and the boundary upper limit SOC and the usable lower limit SOC are fixed values.

First, the management ECU 117 sets an SOC charged from the usable lower limit SOC by a predetermined capacity as the actual use upper limit SOC at the first time (initial setting of the actual use upper limit SOC). Then, in order to constantly acquire the above-described predetermined capacity even in a case where the capacity at the actual use upper limit SOC decreases due to the deterioration of the capacitor 101, the actual use upper limit SOC is updated in the increasing direction from the useable lower limit SOC by the above-described predetermined capacity. Hereinafter, the predetermined capacity to be constantly maintained is also referred to as a target capacity.

Figure 3:
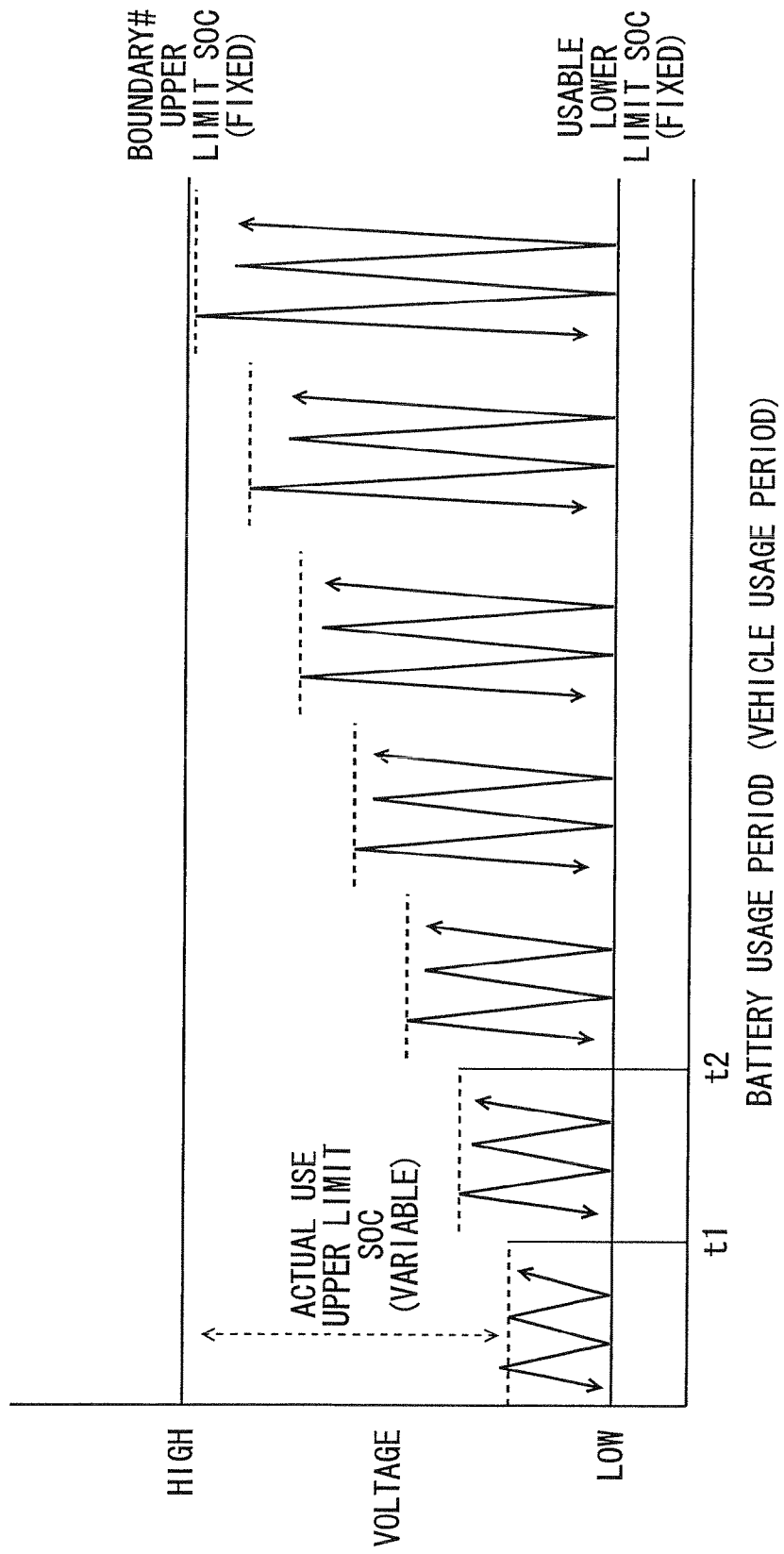
FIG. 3 is a diagram illustrating an example of the relationship between the usage period and the SOC of a capacitor according to the first embodiment of the present invention.
Figure 4:
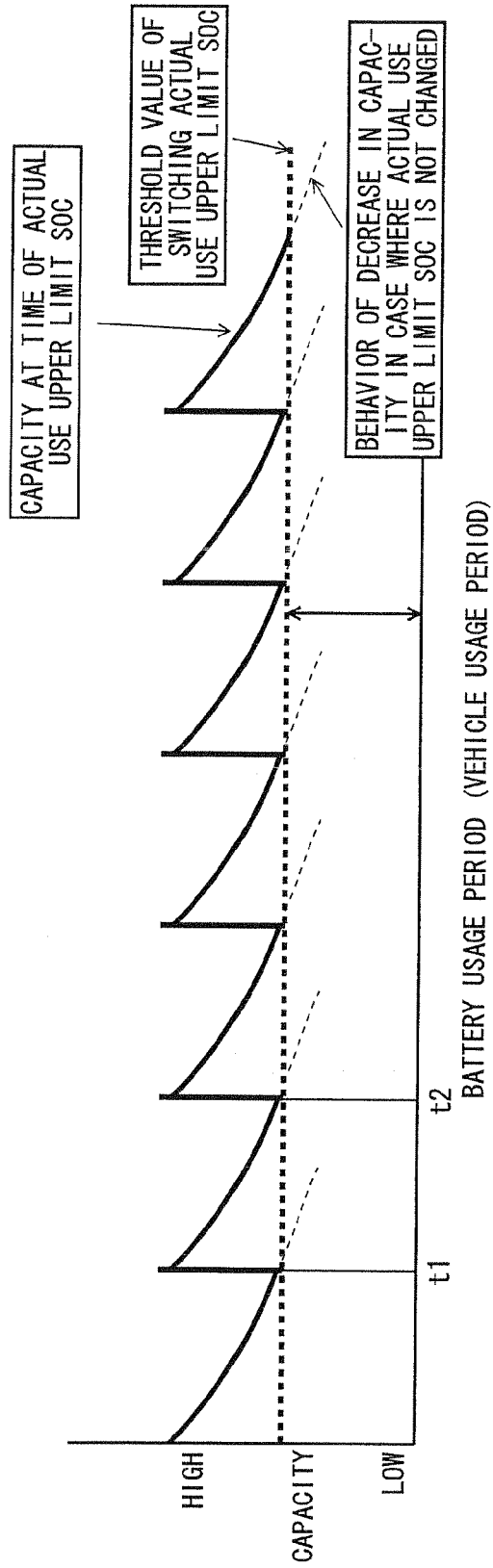
FIG. 4 is a diagram illustrating an example of the relationship between the usage period of the capacitor according to the first embodiment of the present invention and the capacity thereof at the actual use upper limit SOC.

FIG. 3 is a diagram illustrating an example of the relationship between the period of use of the capacitor and the voltage of the capacitor 101 at each SOC. FIG. 4 is a diagram illustrating an example of the relationship between the period of use of the capacitor and the capacity of the capacitor 101 at the actual use upper limit SOC. When the capacitor 101 is repeatedly charged the capacitor at the actual use upper limit SOC set at the first time several times, as illustrated in FIG. 4, a capacity that is equal to or greater than a predetermined switching threshold value cannot be acquired at time t1 as the capacity of the actual use upper limit SOC. The switching threshold value, for example, is the same value as a requisite minimum capacity that is necessary for driving. At this time (time t1), the management ECU 117, as illustrated in FIG. 3, updates the actual use upper limit SOC in the increasing direction. Then, when the capacitor 101 is repeatedly charged the capacitor at the updated actual use upper limit SOC several times, as illustrated in FIG. 4, a capacity that is equal to or greater than the predetermined switching threshold value as the updated actual use upper limit SOC cannot be acquired at time t2. At this time (time t2), the management ECU 117, as illustrated in FIG. 3, updates the actual use upper limit SOC in the increasing direction again. As described above, when the switching threshold value cannot be acquired as the capacity at the actual use upper limit SOC, the management ECU 117 repeats to update the actual use upper limit SOC. In addition, when the update is performed at a short period, the variation in the capacity of the SOC is small, and a rapid change in the behavior of the vehicle, for example, a driving distance for the EV driving without driving the ENG can be prevented.

Figure 5:
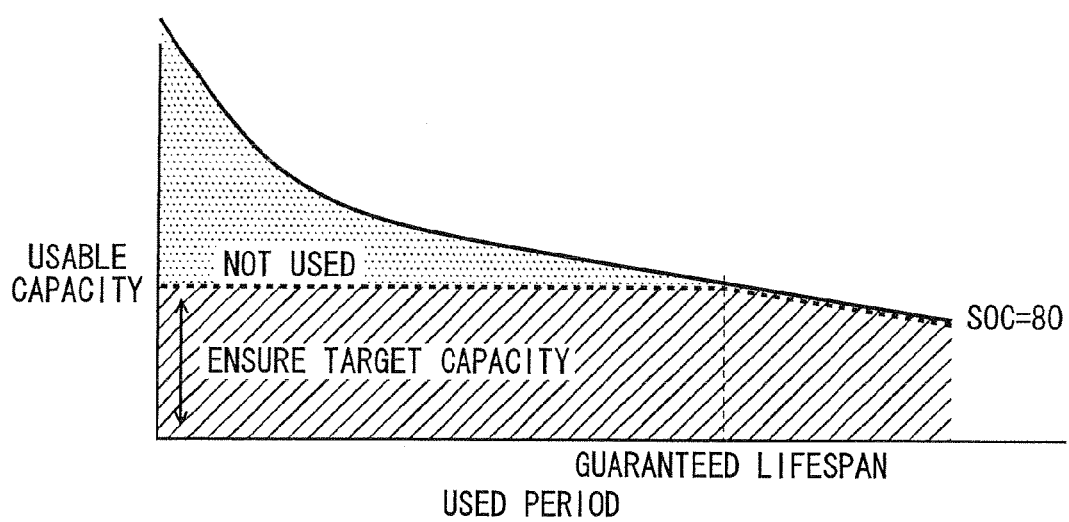
FIG. 5 is a diagram illustrating an example of the relationship between the usage period and the usable capacity of the capacitor according to the first embodiment of the present invention in a case where the capacitor deteriorates as supposed.

By performing such SOC control, in a case where the capacitor 101 deteriorates as supposed, as illustrated in FIG. 5, when the capacitor 101 arrives at the guaranteed lifespan, it is in a state in which the capacity to be used can be acquired (that is, the target capacity can be acquired), but thereafter a state is immediately formed in which the target capacity cannot be acquired. In other words, when the guaranteed lifespan elapses, the usable capacity is equal to the target capacity. FIG. 5 is a diagram illustrating an example of the relationship between the usage period and the usable capacity in a case where the capacitor 101 deteriorates as supposed.

Figure 6:
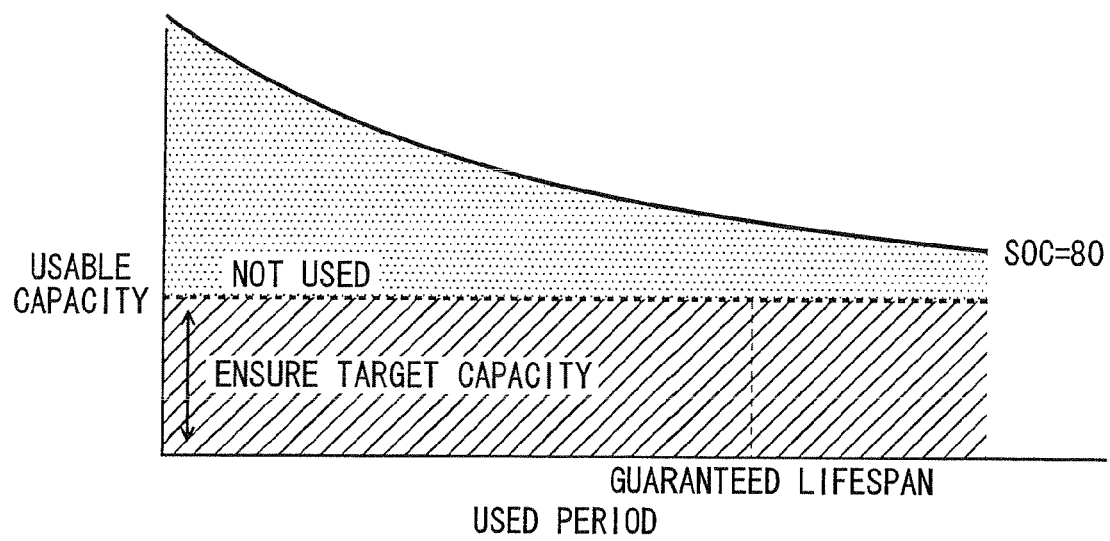
FIG. 6 is a diagram illustrating an example of the relationship between the usage period and the usable capacity of the capacitor according to the first embodiment of the present invention in a case where the capacitor deteriorates less than supposed.

In addition, in a case where the capacitor 101 deteriorates less than supposed, as illustrated in FIG. 6, when the capacitor 101 arrives at the guaranteed lifespan, it is in a state in which the target capacity can be acquired still, and thereafter, a state is formed in which the target capacity can be acquired for the time being. In other words, when the guaranteed lifespan elapses, the usable capacity is larger than the target capacity. FIG. 6 is a diagram illustrating an example of the relationship between the usage period and the usable capacity in a case where the capacitor 101 deteriorates less than supposed.

Figure 7:
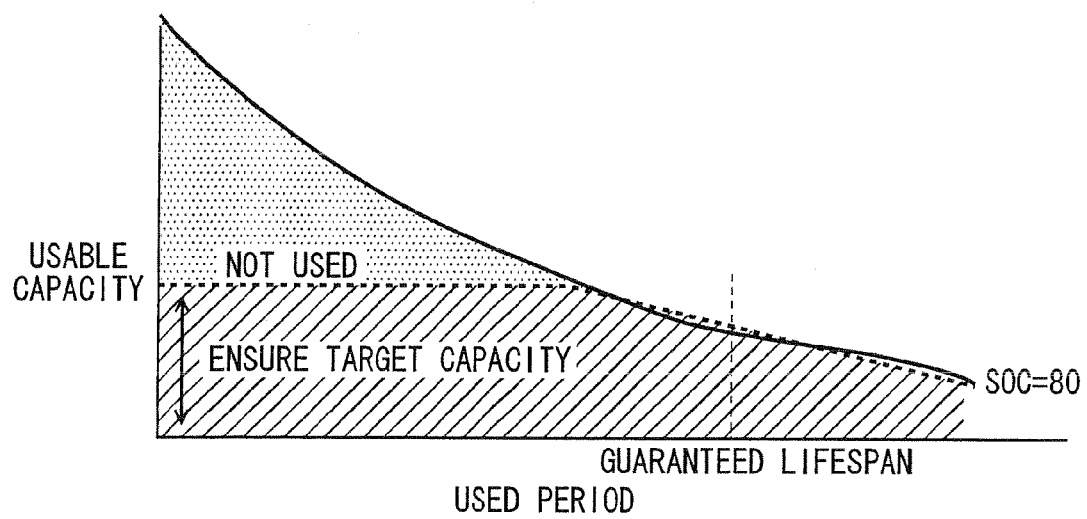
FIG. 7 is a diagram illustrating an example of the relationship between the usage period and the usable capacity of the capacitor according to the first embodiment of the present invention in a case where the capacitor deteriorates more than supposed.

In addition, in a case where the capacitor 101 deteriorates more than supposed, as illustrated in FIG. 7, when the capacitor 101 arrives at the guaranteed lifespan, a state is already formed in which the target capacity cannot be acquired. In other words, when the guaranteed lifespan elapses, the usable capacity is less than the target capacity. FIG. 7 is a diagram illustrating an example of the relationship between the usage period and the usable capacity in a case where the capacitor 101 deteriorates more than supposed. In addition, in a case where deterioration more than is supposed occurs as illustrated in FIG. 7, the occurrence of a malfunction in the capacitor 101 may be estimated and is notified of. Such an estimation of the malfunction is performed by the management ECU 117, and a notification unit not shown in the figure is notified of the indication thereof.

Figure 8:
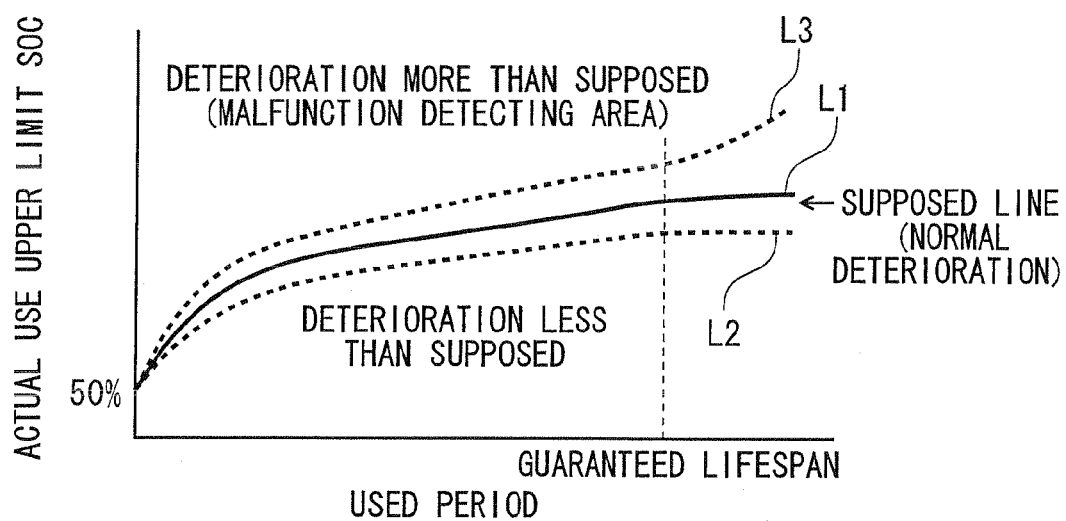
FIG. 8 is a diagram illustrating an example of the relationship between the usage period and the actual use upper limit SOC of the capacitor according to the first embodiment of the present invention for each deterioration state.

The relationship between the usage period and the actual use upper limit SOC of each of the capacitors 101 that deteriorate as illustrated in FIGS. 5 to 7 is illustrated in FIG. 8. In other words, for example, when the capacitor is started to be used at an actual use upper limit SOC of 50(%), and the case of deterioration as is supposed is L1, in the case of the deterioration less than is supposed, as represented as L2, the degree of increase in the actual use upper limit SOC is relatively low. On the other hand, in the case of the deterioration more than supposed, as represented as L3, the degree of increase in the actual use upper limit SOC is relatively high. FIG. 8 is a diagram illustrating an example of the relationship between the usage period and the actual use upper limit SOC of the capacitor 101 for each deterioration state.

By charging the capacitor 101 between the usable lower limit SOC and the actual use upper limit SOC as described above by controlling the actual use SOC using the management ECU 117 as described above, the same capacity is used regardless of the use period of the capacitor 101. Accordingly, even when the usable capacity of the capacitor 101 is small from the start of the use of the capacitor 101, the ratio of the motor driving is the same as that at the time of a new product, and accordingly, a user does not get a feeling of strangeness. In addition, since the SOC use range of the capacitor is limited between the usable lower limit SOC and the actual use upper limit SOC in which only the target capacity (≤ usable capacity) is charged, it is possible to suppress the deterioration of the capacitor 101 due to the maintaining of the high SOC state.

Next, an operation performed when the capacitor 101 of the vehicle illustrated in FIG. 1 is charged will be described.

Figure 9:
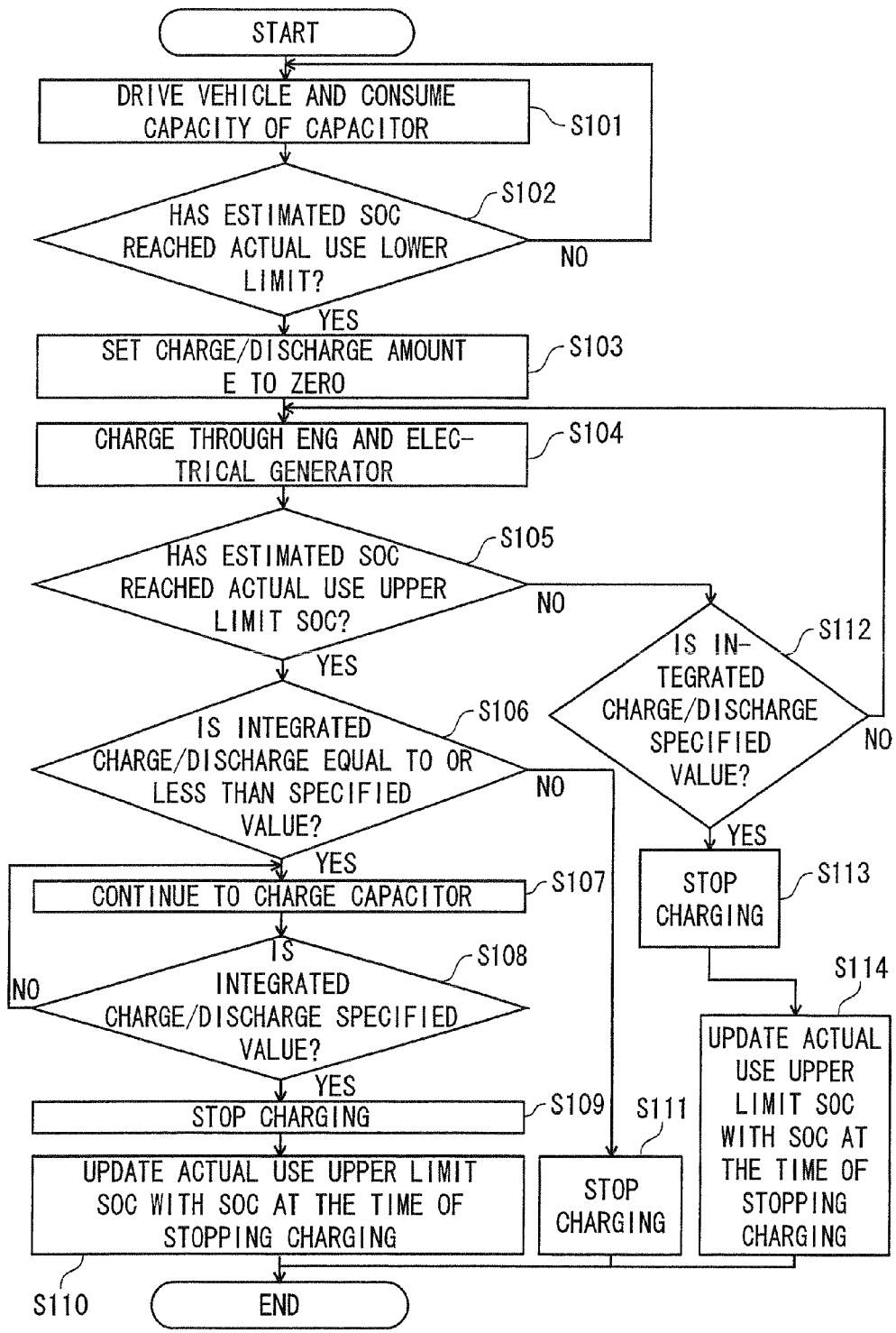
FIG. 9 is a flowchart illustrating an example of an operation at the time of updating the actual use upper limit SOC according to the first embodiment of the present invention.

FIG. 9 is a flowchart illustrating an example of an operation at the time of updating the actual use upper limit SOC according to this embodiment. In FIG. 9, it is assumed that the charging of the capacitor 101 is started when the estimated SOC is below the usable lower limit SOC due to the consumption of the capacity, for example, during the driving of the vehicle.

As the vehicle consumes the electric power by being driven or the like, the capacity of the capacitor 101 is consumed (Step S101). The management ECU 117 determines whether or not the estimated SOC arrives at the usable lower limit SOC of the capacitor 101 due to the consumption of the estimated SOC (Step S102). In a case where the estimated SOC is determined to arrive at the usable lower limit SOC, the management ECU 117 resets the charge/discharge amount E, so that E=0 (Step S103). After the charge/discharge amount E is reset, the calculation of the charge/discharge amount is started.

After the charge/discharge amount is reset, generation of electricity is started using the internal combustion engine 107 and the electrical generator 109 based on an instruction of the management ECU 117, whereby the charging of the capacitor 101 is started (Step S104). After the charging is started, the management ECU 117 determines whether or not the estimated SOC has arrived at the actual use upper limit SOC of the capacitor 101 (Step S105).

In a case where the estimated SOC is determined to have arrived at the actual use upper limit SOC, the management ECU 117 determines whether or not the calculated charge/discharge amount is equal to or less than a specified value (Step S106). In a case where the charge/discharge amount is determined to be larger than the specified value, the management ECU 117 performs such control that the charging of the capacitor 101 is stopped (Step S111). In order to stop the charging, the generation of electricity using the internal combustion engine 107 and the electrical generator 109 is stopped so as to stop the charging of the capacitor 101 based on an instruction of the management ECU 117. In addition, the specified value that is compared with the charge/discharge amount is set in advance.

In a case where the charge/discharge amount is equal to or less than the specified value, the management ECU 117 performs control so as to continue the charging of the capacitor 101 (Step S107) and determines whether or not the calculated charge/discharge amount has arrived at the specified value (Step S108). In a case where the calculated charge/discharge amount is determined not to have arrived at the specified value, the management ECU 117 performs control so as to continue the charging of the capacitor 101.

On the other hand, in a case where the calculated charge/discharge amount is determined to have arrived at the specified value, the management ECU 117 performs control so as to stop the charging of the capacitor 101 (Step S109). Then, the management ECU 117 updates the actual use upper limit SOC of the capacitor 101 with the estimated SOC of the capacitor 101 at the time of stopping the charging (Step S110). Here, the actual use upper limit SOC is updated in the increasing direction.

On the other hand, in a case where the estimated SOC is determined not to have arrived at the actual use upper limit SOC in Step S105, the management ECU 117 determines whether or not the calculated charge/discharge amount has arrived at the specified value (Step S112). In a case where the charge/discharge amount is determined not to have arrived at the specified value, the process is returned back to Step S104, and the management ECU 117 performs control so as to continue to charge the capacitor 101.

In a case where the charge/discharge amount is determined to have arrived at the specified value, the management ECU 117 performs control so as to stop the charging of the capacitor 101 (Step S113). Then, the management ECU 117 updates the actual use upper limit SOC of the capacitor 101 with the estimated SOC of the capacitor 101 at the time of stopping the charging (Step S114). Here, the actual use upper limit SOC is updated in the decreasing direction.

By performing the process illustrated in FIG. 9, charging/discharging can be performed while suppressing the progress of deterioration of the capacitor so as to charge the capacitor 101 without causing a user to have a feeling of strangeness during driving and performing unnecessary charging/discharging of the capacitor. Thus, the life of the capacitor 101 can be lengthened. For example, in a case where the capacitor deteriorates, a case may be considered in which the charge/discharge amount does not arrive at the specified value even when the estimated SOC arrives at the actual use upper limit SOC. In this case, by performing control so as to increase the actual use upper limit SOC, it is possible to minimize promotion of the deterioration of the capacitor without causing the user to have a feeling of strangeness.

Since the charge/discharge amount that is calculated by the management ECU 117 is calculated through integration for every predetermined period, the integration error may be large in many cases, and particularly, in a case where integration is performed during the driving of the vehicle, discharge for driving is also included in the charge/discharge amount, and accordingly, the error may be further increased. For example, in a case where the actual use upper limit SOC is set too highly due to an error, a case may be considered in which the charge/discharge amount arrives at the specified value even when the estimated SOC does not arrive at the actual use upper limit SOC. Even in such a case, since there is no problem even when the actual use upper limit SOC is lowered, by performing control of decreasing the actual use upper limit SOC, the deterioration of the capacitor 101 can be prevented further.

Figure 10:
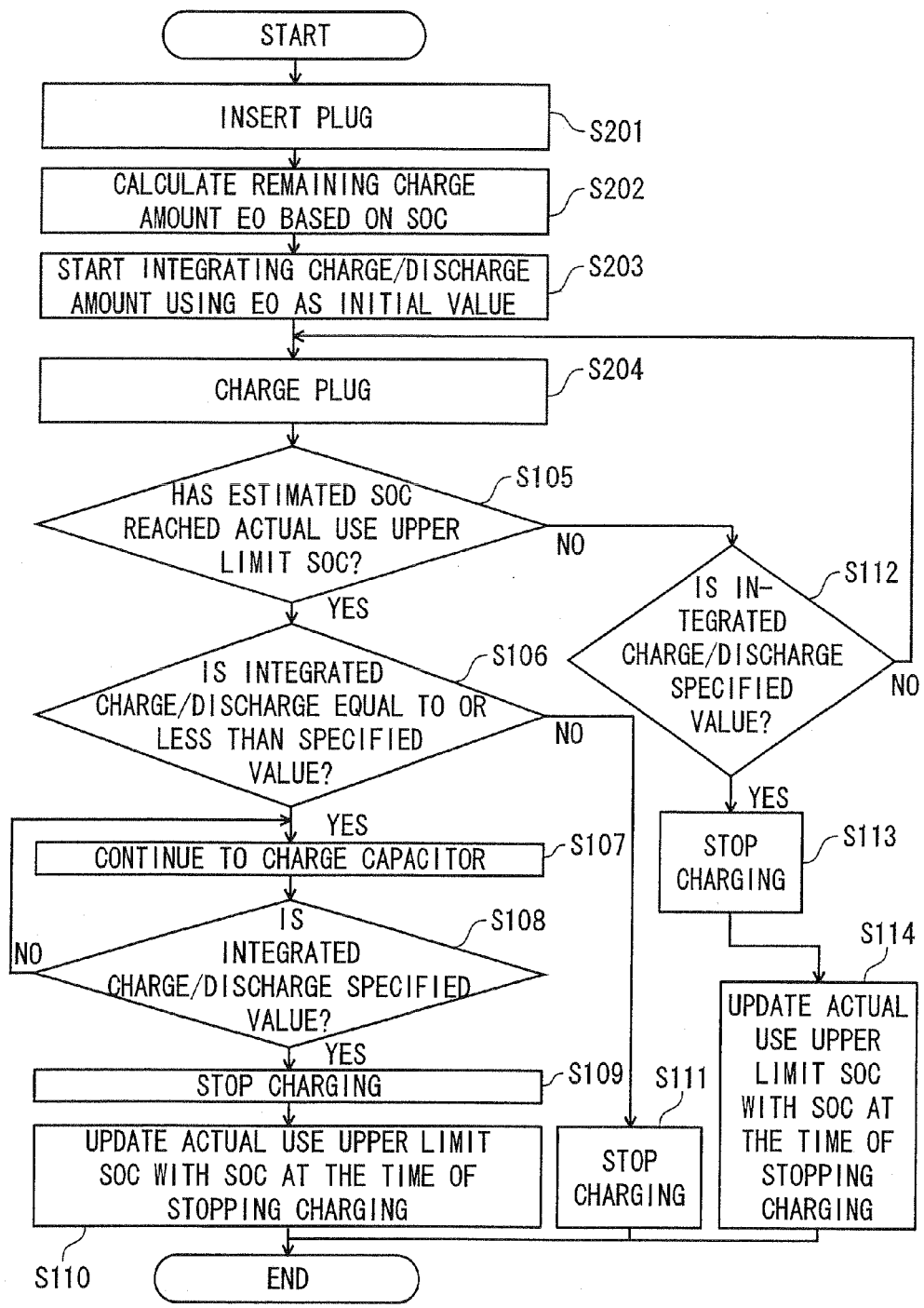
FIG. 10 is a flowchart illustrating an example of another operation at the time of updating the actual use upper limit SOC according to the first embodiment of the present invention.

Next, FIG. 10 is a flowchart illustrating another example of the operation performed when the actual use upper limit SOC according to this embodiment is updated. In FIG. 10, it is assumed that the charging of the capacitor 101 is started when a connection portion stretching from the charger 137 is connected to the external power supply source 139, for example, during the stopping of the vehicle.

When determining that a plug stretching from the charger 137 as the connection portion is inserted into the external power supply source 139 so as to be connected thereto (Step S201), the management ECU 117 calculates the remaining electricity amount of the capacitor 101 at the time of the connection (Step S202). In this case, in a case where the actual usable SOC set at the time of the plug connection is B (%), the usable lower limit SOC is C (%), the target value of the charge/discharge amount is A (Wh), and the estimated SOC estimated at the time of the plug connection is X (%), the remaining electricity amount E0 at the time of plug connection is calculatede as the following Number 1.

$$E0 = \frac{X - C}{B - C} \times A \qquad (1)$$

In addition, it may be configured such that the latest charge/discharge amount at a time when the estimated SOC is the usable lower limit SOC is stored in a memory unit not shown in the figure, and the charge/discharge amount stored in the memory unit at the time of the plug connection is regarded as the remaining electricity amount of the capacitor 101.

After calculating the remaining electricity amount of the capacitor 101, the management ECU 117 calculates the charge/discharge amount by using E0 as its initial value (Step S203) and performs control so as to start plug charging in which power is supplied from the external power supply source 139 so as to charge the capacitor 101 (Step S204). Since the initial value of the charge/discharge amount is E0, the remaining electricity amount of the capacitor 101 at the time of the plug connection is also included in the charge/discharge amount calculated after the charging is started, together with the charge/discharge amount due to the plug charging.

After the charging is started, the process that is similar to that of S105 to Step S114 illustrated in FIG. 9 is performed. However, comparing the charge/discharge amount and a specified value (corresponding to a target value A of the charge/discharge amount) in Steps S106, S108, and S112, as described earlier, the remaining electricity amount of the capacitor 101 at the time of the plug connection is also included in the charge/discharge amount. In addition, when determining that the charge/discharge amount has not arrived at the specified value in Step S112, the process is returned to Step S204, and the management ECU 117 performs control so as to continue the charging of the capacitor 101.

By performing the process illustrated in FIG. 10, the life of the capacitor 101 can be lengthened by charging the capacitor while suppressing the progress of deterioration of the capacitor without causing a user to have a feeling of strangeness during driving and performing unnecessary charging/discharging of the capacitor. In addition, since the charge/discharge amount calculated by the management ECU 117 is calculated through integration for every predetermined period, the integration error may be large in many cases, and particularly, in a case where the integration is performed during the driving of the vehicle, the discharging for driving is also included in the charge/discharge amount, and accordingly, there is a possibility that the error further increases. In contrast to this, in FIG. 10, since the plug charging is performed, the error due to the discharging disappears, and accordingly, the actual use upper limit SOC can be updated more precisely. Thus, the deterioration of the capacitor 101 can be prevented.

In addition, in this embodiment, it is assumed that the charging of the capacitor 101 is started when the connection portion stretching from the charger 137 is connected to the external power supply source 139 during stopping of the vehicle. However, the remaining electricity amount may be similarly acquired also in a case where the electrical generator 109 is operated, for example, when the internal combustion engine 107 operates at the time of heating for cold temperature, or when a high output is requested as in a case where electric power supplied from the capacitor 101 is insufficient during the driving of the vehicle, or the like.

Figure 11:
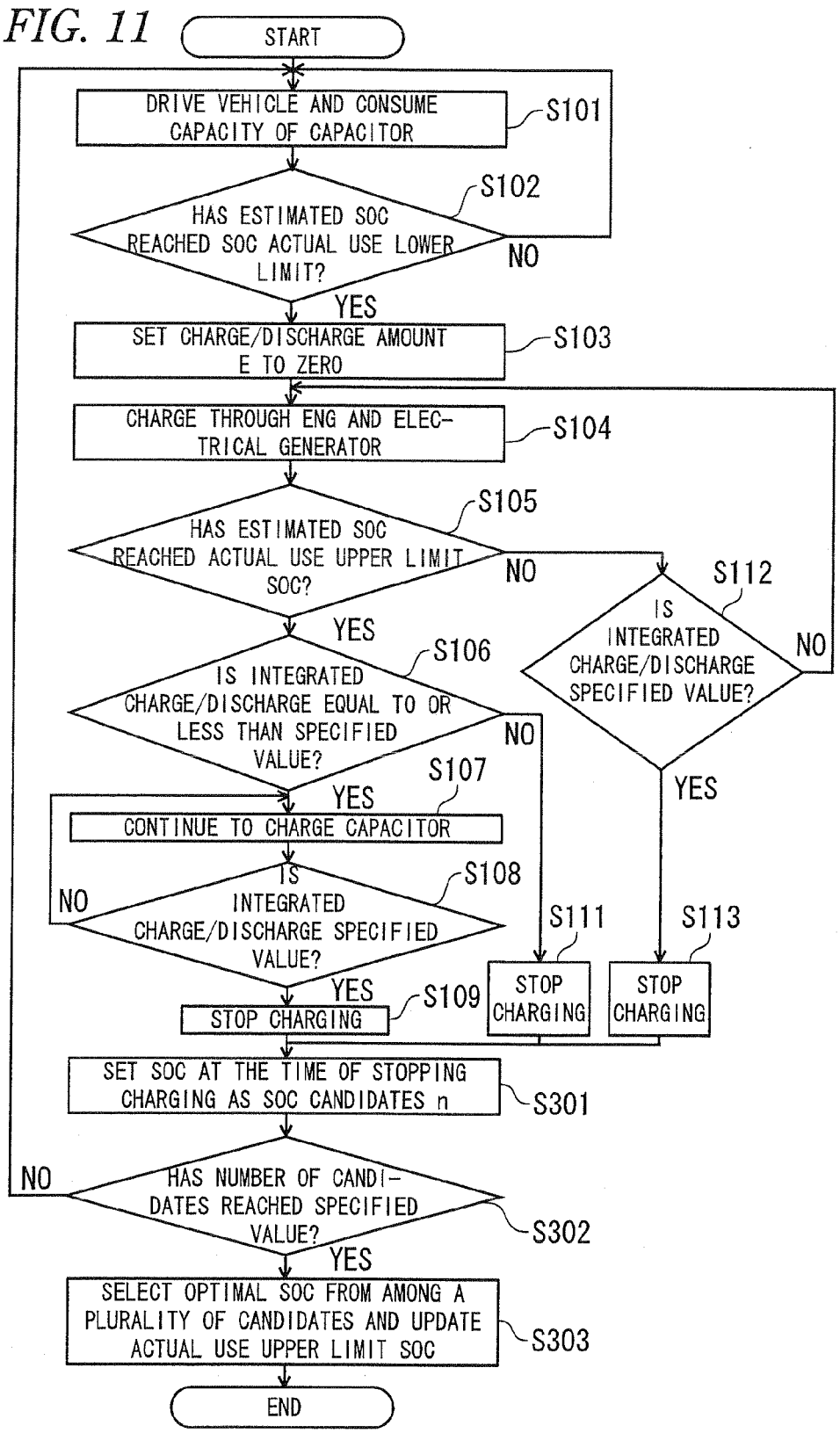
FIG. 11 is a flowchart illustrating an example of still another operation at the time of updating the actual use upper limit SOC according to the first embodiment of the present invention.

FIG. 11 is a flowchart illustrating an example of still another operation at the time of updating the actual use upper limit SOC according to this embodiment. In FIG. 11, a case is assumed in which the actual use upper limit SOC is updated with a selected SOC from among a plurality of SOC candidates.

First, the process that is similar to that illustrated in FIG. 9 is performed. However, after the stopping of the charging in Steps S109 and S113, the update of the actual use upper limit SOC is not performed in Steps S110 and S114. Instead of performing the update, after stopping of the charging in Steps S109, S111, and S113, the management ECU 117 stores an estimated SOC at the time of the stopping of the charging in the memory unit (not shown) as a candidate n of the actual use upper limit SOC (Step S301). In other words, when the charge/discharge amount calculated by the management ECU 117 arrives at the specified value after the starting of charging, the actual use upper limit SOC is not immediately updated, but the estimated SOC at the time of the stopping of charging is stored in the memory unit (not shown) as a candidate for updating the actual use upper limit SOC at once.

Then, the management ECU 117 determines whether or not the number of candidates stored in the memory unit arrives at a specified number (Step S302). In a case where the number of candidates does not arrive at the specified number, in order to search for a next candidate, the process is returned to Step S101.

On the other hand, in a case where the number of candidates arrives at the specified number, the management ECU 117 selects an optimal SOC from among a plurality of candidates stored in the memory unit and updates the actual use upper limit SOC with the selected SOC (Step S303). As a method of selecting the SOC, for example, a method in which a median value of the plurality of candidates is selected, a method in which an average value of the plurality of candidates is selected, a method in which an average value of a maximum value and a minimum value of the plurality of candidates is selected, and a method in which a most frequent value is selected from among the plurality of candidates, or the like may be considered.

By performing the process illustrated in FIG. 11, an estimated SOC is stored in the memory unit (not shown) every time the calculated charge/discharge amount arrives at the specified value, and an optimal SOC is selected from the plurality of SOC candidates. Accordingly, even when there is an error to some degree for the SOC candidate value of each time, the actual use upper limit SOC can be updated more precisely.

In Step S302, although a case has been described in which whether or not the number of candidates arrives at the specified number is determined, for example, whether or not a predetermined time elapses from the start of charging may be determined. In other words, an estimated SOC is stored in the memory unit every time the charge/discharge amount arrives at the specified value between the predetermined time.

In addition, in FIG. 11, it is assumed that a process similar to that illustrated in FIG. 9, that is, charging using electricity generation of the internal combustion engine 107 and the electrical generator 109 is performed. However, a process that is similar to that illustrated in FIG. 10, that is, the process in which, for the plug charging, an optimal SOC candidate is selected from a plurality of SOC candidates, and the actual use upper limit SOC is updated may be performed.

Although his embodiment has been described using an HEV, the present invention can be also applied to a different type of electrically powered vehicle such as an EV (Electric Vehicle), a PHEV (Plugin Hybrid Electrical Vehicle), an FCV (Fuel Cell Vehicle), a PFCV (Plugin Fuel Cell Vehicle), or the like.

Second Embodiment

A charge controller according to an embodiment of the present invention will be described with reference to drawings.

An HEV (Hybrid Electrical Vehicle) includes an electric motor and an internal combustion engine and is driven by the driving forces of the electric motor and/or the internal combustion engine in accordance with the driving state of the vehicle. The HEV can be broadly classified into two types including a serial type and a parallel type. The serial-type HEV is driven by the driving force of the electric motor that uses a capacitor as a power source. The internal combustion engine is used only for generating electric power, and the electric power generated by the driving force of the internal combustion engine is charged in a battery or is supplied to the electric motor. On the other hand, the parallel-type HEV is driven by one or both of the electric motor and the internal combustion engine. In addition, a serial-parallel type HEV that combines both types is also known.

Hereinafter, the serial-type HEV will be described representatively. However, the present invention can be also applied to an HEV of a different type.

Figure 12:
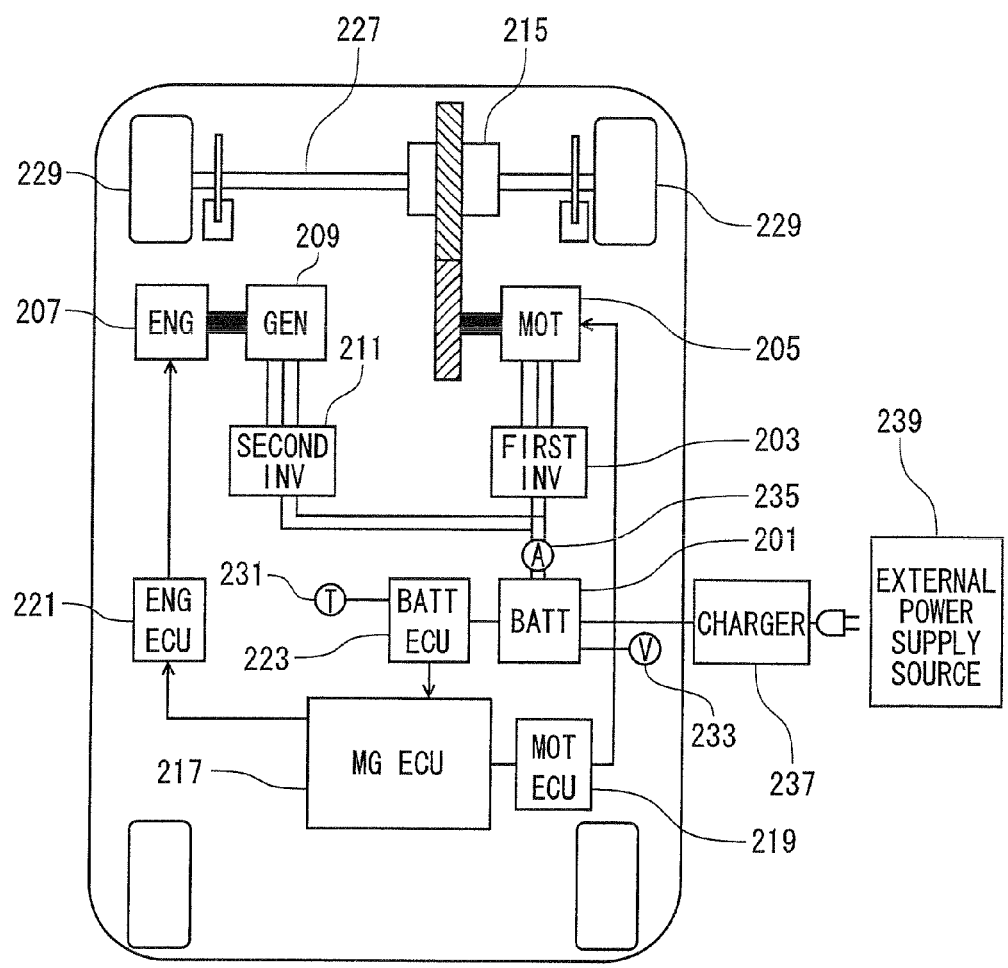
FIG. 12 is a block diagram illustrating an example of the internal configuration of a vehicle according to a second embodiment of the present invention.

FIG. 12 is a block diagram illustrating the internal configuration of a serial-type HEV. In the series-type HEV (hereinafter, briefly referred to as a "vehicle") illustrated in FIG. 12, a driving force generated by an electric motor 205 that uses a capacitor 201 as a power source is delivered to drive wheels 229 through a gear box (gear) 215.

In addition, the driving form of this vehicle is "EV driving" or "serial driving". During the EV driving, the vehicle is driven by the driving force of the electric motor (MOT) 205 that is driven by the supply of power from the capacitor (BATT) 201. On the other hand, during the serial driving, the vehicle is driven by the driving force of the electric motor 205 that is driven by the supply of electric power generated by the electrical generator (GEN) 209 in accordance with the supply of power from the capacitor 201 and the driving of the internal combustion engine 207.

The vehicle illustrated in FIG. 12 includes the capacitor (BATT) 201, a first inverter (first INV) 203, the electric motor (MOT) 205, the multi-cylinder internal combustion engine (ENG) 207, the electrical generator (GEN) 209, a second inverter (second INV) 211, a gear box (hereinafter, briefly referred to as a "gear") 215, a management ECU (MG ECU) 217, a motor ECU (MOT ECU) 219, an engine ECU (ENG ECU) 221, and a battery ECU (BATT ECU) 223.

The capacitor 201 has a plurality of charge cells connected in series and supplies a high-level voltage, for example, of 100 to 200V, and a battery such as a lithium ion battery is built therein. In addition, the full charging capacity of the capacitor 201 differs in accordance with the degree of deterioration caused by long-term use or the like even at the same SOC.

The first inverter 203 converts a DC voltage supplied from the capacitor 201 into an AC voltage and supplies a three-phase current to the electric motor 205. The electric motor 205 generates power (torque) that is used for driving the vehicle. The torque that is generated by the electric motor 205 is delivered to a drive shaft 227 of the drive wheels 229 through the gear 215.

The multi-cylinder internal combustion engine (hereinafter, briefly referred to as an "internal engine") 207 generates power (torque), and the power is consumed by the electrical generator 209. The electrical generator 209 is directly connected to the internal combustion engine 207.

The electrical generator 209 generates electric power by being driven by the internal combustion engine 207. The electric power generated by the electrical generator 209 is charged in the capacitor 201 or is supplied to the electric motor 205. The second inverter 211 converts an AC voltage generated by the electrical generator 209 into a DC voltage. The electric power converted by the second inverter 211 is charged in the capacitor 201 or is supplied to the electric motor 205 through the first inverter 203.

The gear 215 is a transmission that converts the driving force delivered from the electric motor 205 into a force with the number of revolutions and torque at a desired transmission gear ratio and transfers the converted force to the drive shaft 227. In addition, the gear 215 and the rotor of the electric motor 205 are directly connected to each other.

The management ECU 217 performs switching between the EV driving and the serial driving and controls the electric motor 205 and the internal combustion engine 207 and the like. In addition, the management ECU 217 receives information transmitted from a vehicle speed sensor (not shown) that detects the speed of the vehicle and information such as the degree of opening of the accelerator that is transmitted from a demanded driving force sensor (not shown) that detects the driving force of the vehicle, which is demanded by a driver or the like. The management ECU 217 calculates at least one of the charge amount of the capacitor 201 and the discharge amount of the capacitor 201 (hereinafter, referred to as a charge/discharge amount) and controls the charge state (SOC: State of Charge) of the capacitor 201, which will be described later in detail. Here, the charge/discharge amount is the amount of energy.

A motor ECU 219 controls the electric motor 205 in accordance with an instruction transmitted from the management ECU 217. In addition, the motor ECU 219 controls a current that is supplied from the capacitor 201 to the electric motor 205 when the vehicle speed is instructed to be limited from the management ECU 217. The engine ECU 221 controls the start or the stop of the internal combustion engine 207, opening/closing of a throttle valve of each cylinder and fuel injection, and the number of revolutions of the crankshaft of the internal combustion engine 207 in accordance with an instruction transmitted from the management ECU 217.

A temperature sensor 231 detects the temperature of the capacitor 201. In addition, a voltage sensor 233 detects the voltage applied between the terminals of the capacitor 201. A current sensor 235 detects at least one (hereinafter, referred to as a charge/discharge current) of a charge current flowing into the capacitor 201 and a discharge current flowing out of the capacitor 201. Such detection can be performed, for example, on a regular basis, and the detection timing can be set in a flexible manner.

A charger 237 receives power supply from an external power supply source 239 disposed outside the vehicle and converts an AC voltage into a DC voltage.

The external power supply source 239 is arranged at a charging station or inside a house and supplies electric power to the charger 237 so as to supply electric power having an AC voltage to a vehicle.

Figure 13:
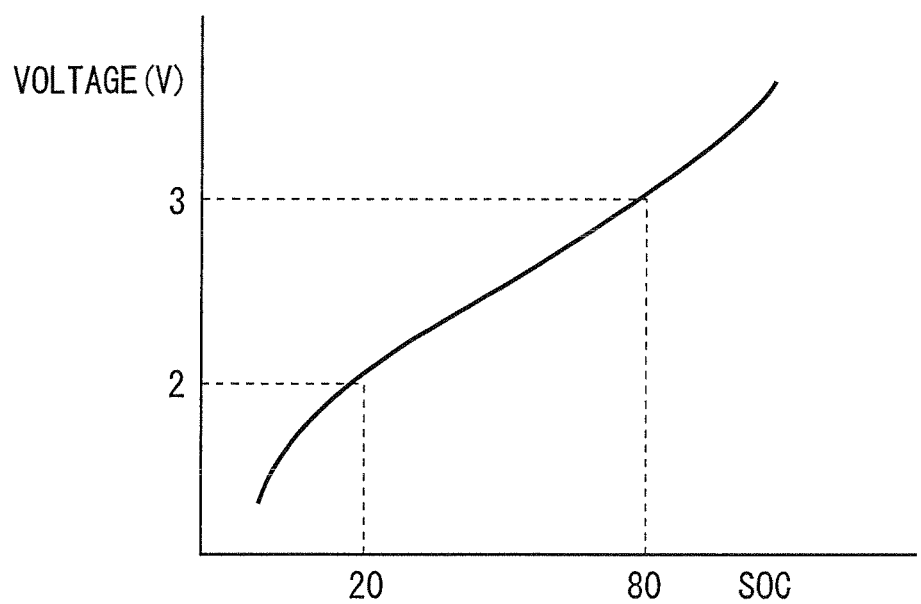
FIG. 13 is an example of a diagram illustrating the relationship between the voltage and the SOC.

The battery ECU 223 estimates the charge state (SOC) of the capacitor 201 and transmits information indicating the state to the management ECU 217. At this time, the battery ECU 223 estimates the SOC of the capacitor 201 through real-time calculation that is based on the voltage detected by the voltage sensor 233. Since there is correlation between the SOC and the voltage of the capacitor 201, such an estimation can be attained. FIG. 13 is a diagram illustrating an example of the relationship between the voltage and the SOC. In addition, the SOC may be estimated based on the current detected by the current sensor 235 or the temperature detected by the temperature sensor 231. For example, the SOC may be estimated by correcting the detected voltage based on the detected current or the detected temperature. Furthermore, by using an internal resistance value of the capacitor 201, the SOC may be estimated in the sequence represented by the flow illustrated in FIG. 14 to be described later.

In addition, the management ECU 217 calculates at least one (hereinafter, referred to as a charge/discharge amount) of the charge amount of the capacitor 201 and the discharge amount of the capacitor 201 by integrating the charge/discharge current detected by the current sensor 235 at every predetermined period. This calculation method is called a current integration method. For example, the management ECU 217 calculates the charge/discharge amount that is integrated from the start of charging.

Figure 14:
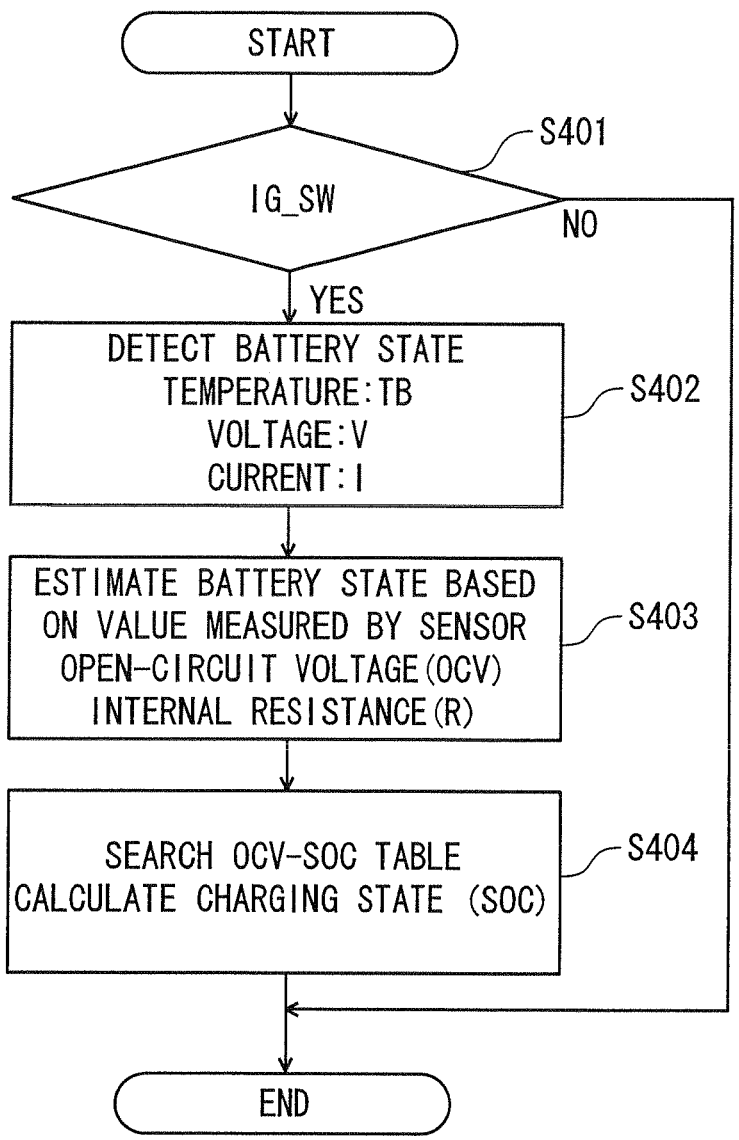
FIG. 14 is a flowchart illustrating an example of an operation for updating the SOC of the capacitor according to the second embodiment of the present invention.

Next, an operation for estimating the SOC of the capacitor 201 using an internal resistance value will be described. FIG. 14 is a flowchart illustrating an example of the operation for estimating the SOC of the capacitor 201 using the internal resistance value in the vehicle.

First, the management ECU 217 determines whether the ignition is On (Step S401). In a case where the ignition is not On, the process illustrated in FIG. 14 is completed.

In a case where the ignition is On, the battery ECU 223 detects the battery state of the capacitor 201 (Step S402). To be more specific, the battery ECU 223 performs control such that the temperature of the capacitor 201 is detected by the temperature sensor 231, the voltage of the capacitor 201 is detected by the voltage sensor 233, and the charge/discharge current of the capacitor 201 is detected by the current sensor 235.

Subsequently, the battery ECU 223 acquires the internal resistance value in advance or in real time (Step S403). In a case where the internal resistance value is acquired in advance, the battery ECU 223 acquires the internal resistance value that is measured in advance and is stored in the memory unit (not shown), before starting the process illustrated in FIG. 19.

On the other hand, in a case where the internal resistance value is acquired in real time, an actual voltage change amount dV that is the amount of change in the voltage V between the terminals of the capacitor 201 per predetermined time and an actual current change amount dI that is the amount of change in the charge/discharge current I of the capacitor 201 per predetermined time are sequentially acquired based on the voltage V detected by the voltage sensor 233 and the current I detected by the current sensor 235. Then, the slope value of a linear equation that represents the relationship between the actual voltage change amount dV and actual current change amount dI is calculated as the tentative value r of the internal resistance R using the iterative least square method based on the actual voltage change amount dV and the actual current change amount dI that have been calculated. Then, the tentative value r is corrected using the following (Equation 1). Here, k represents time.

$$R(k)=r(k)+Ga1 \cdot [dV(k-1)-R(k-1) \cdot dI(k-1)] \quad (1)$$

Here, $[dV(k-1)-R(k-1) \cdot dI(k-1)]$ is the deviation between a model value of a voltage change amount that is calculated by multiplying an estimated value $R(k-1)$ (the latest value of the time series of the estimated values) of the acquired internal resistance R by the actual current change amount $dI(k-1)$ at each $(k-1)$ at that time and the actual voltage change amount $dV(k-1)$ at each $(k-1)$ at that time. In addition, Ga1 is a transfer function. In this case, the calculation of multiplying the transfer function Ga1 by the deviation is to calculate the feedback manipulated variables such that the deviation is convergent to zero.

Accordingly, the tentative value r of the internal resistance R is corrected such that the deviation is convergent to zero by using (Equation 1). Accordingly, the estimated values of the internal resistance $R(k)$ are sequentially calculated. The battery ECU 223 acquires the internal resistance $R(k)$ at the current time k in real time.

Subsequently, when acquiring the internal resistance value, the battery ECU 223 estimates an open-circuit voltage OCV of the capacitor 201 based on the following (Equation 2) using the internal resistance value $R(k)$ (Step S403). Here, k represents the time.

$$OCV(k)=Ga2 \cdot [V(k)-\{OCV(k-1)+R(k) \cdot I(k)\}] \quad (2)$$

Here, the value included in the brackets on the right side of (Equation 2) is the deviation between a model value of the voltage between the terminals of the capacitor 201 that is calculated by adding the estimated value $OCV(k-1)$ of the open-circuit voltage OCV that is acquired in advance to a value acquired by multiplying the charge/discharge current $I(k)$ at the current time k by the estimated value $R(k)$ of the internal resistance at the current time k and the voltage $V(k)$ between the terminals at the current time k. In addition, Ga2 on the right side of (Equation 2) is a transfer function. In this case, the calculation of multiplying the deviation by the transfer function Ga2 is to calculate the feedback manipulated variable such that the deviation is convergent to zero.

Accordingly, the open-circuit voltage $OCV(k)$ at the current time k is sequentially calculated such that the deviation is convergent to zero by using (Equation 2).

Figure 15:
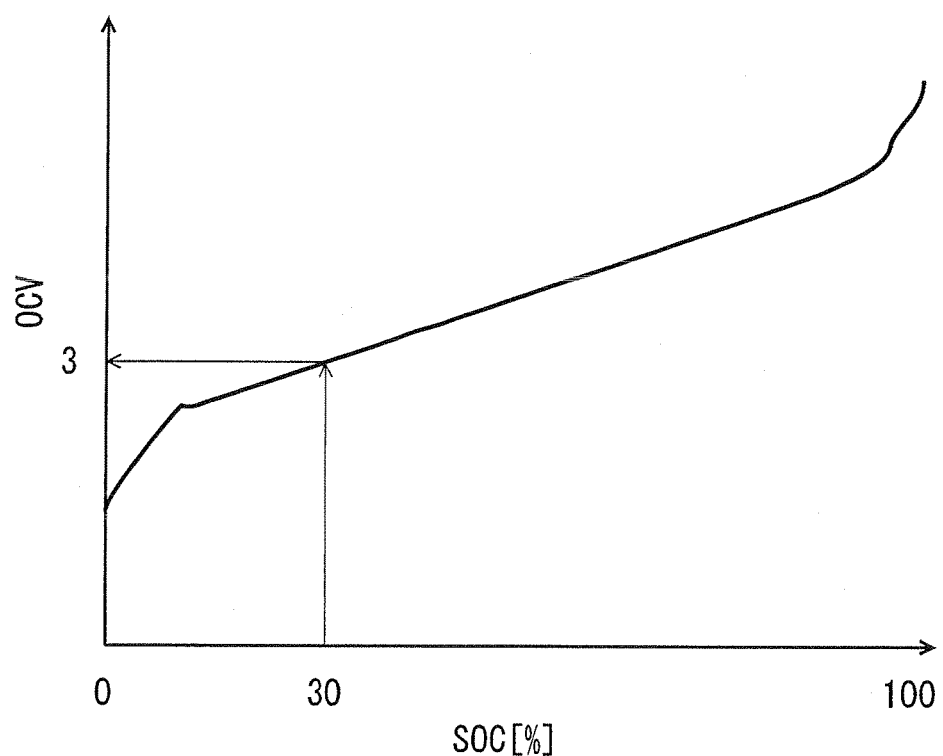
FIG. 15 is a diagram illustrating an example of an SOC-OCV table according to the second embodiment of the present invention.

Subsequently, when the open-circuit voltage OCV is estimated, the battery ECU 223 estimates the SOC of the capacitor 201 based on the estimated open-circuit voltage OCV of the capacitor 201 (Step S404). Here, the relationship between the open-circuit voltage OCV and the SOC, as illustrated in FIG. 15, is relationship (approximately proportional relationship) in which the SOC increases as the open-circuit voltage OCV is increased, and the open-circuit voltage OCV and the SOC have one-to-one correspondence. Thus, the SOC is estimated based on the open-circuit voltage OCV by using FIG.

15. In addition, the relationship illustrated in FIG. 15 is maintained in advance in a memory unit not shown in the figure as an SOC-OCV table.

By estimating the SOC using the internal resistance value R as described above, the charge state can be estimated more accurately without using the measurement result of the voltage sensor 233 that may change during the driving.

Hereinafter, the SOC estimated based on the voltage and the SOC estimated based on the internal resistance are briefly referred to as estimated SOC.

Next, an overview of charging by the vehicle according to this embodiment will be now described.

In this embodiment, a boundary upper limit SOC and a usable lower limit SOC are set in advance. The usable lower limit SOC is set as an SOC corresponding to a lowest voltage that satisfies the demanded output of the vehicle as the initial value. This demanded output of the vehicle is the lowest value of the energy at which electric power discharge and electric power regeneration can be realized in the vehicle and general driving of the vehicle can be performed. The management ECU 217 sets an actual use upper limit SOC and an actual use lower limit SOC between the boundary upper limit SOC and the usable lower limit SOC and charges the capacitor 201 between the actual use lower limit SOC and the actual use upper limit SOC based on the above-described estimated SOC and the above-described charge/discharge amount. In other words, since charging is performed while maintaining the SOC that is equal to or greater than the actual use lower limit SOC, it is possible to charge the capacitor up to a necessary and sufficient amount while satisfying the demanded output of the vehicle. Here, the actual use upper limit SOC and the actual use lower limit SOC are variable values, and the boundary upper limit SOC and the usable lower limit SOC are fixed values.

The management ECU 117 sets the actual use lower limit SOC that satisfies the demanded output of the vehicle in accordance with the internal resistance value of the capacitor 201. As the initial value, although the actual use lower limit SOC, for example, has the same value as the usable lower limit SOC, as the capacitor 201 deteriorates as the use period becomes longer, the usable lower limit SOC cannot satisfy the demanded output of the vehicle. On the other hand, since the actual use lower limit SOC is updated by the management ECU 217, the actual use lower limit SOC is controlled so as to constantly satisfy the demanded output of the vehicle (update of the actual use lower limit SOC).

In addition, the management ECU 217 sets an SOC charged from the usable lower limit SOC by a predetermined capacity as the actual use upper limit SOC at the first time (initial setting of the actual use upper limit SOC). Then, in order to constantly acquire the above-described predetermined capacity even in a case where the capacity at the actual use upper limit SOC decreases due to the deterioration of the capacitor 201, the actual use upper limit SOC is updated in the increasing direction from the useable lower limit SOC by the above-described predetermined capacity (the first update of the actual use upper limit SOC). Hereinafter, the predetermined capacity to be constantly maintained is also referred to as a target capacity. Furthermore, there is also a case where the management ECU 217 updates the actual use upper limit SOC in accordance with the value of the actual use lower limit SOC (the second update of the actual use upper limit SOC). In this case, the actual use upper limit SOC is controlled so as to be the target capacity from the actual use lower limit SOC.

Figure 16:
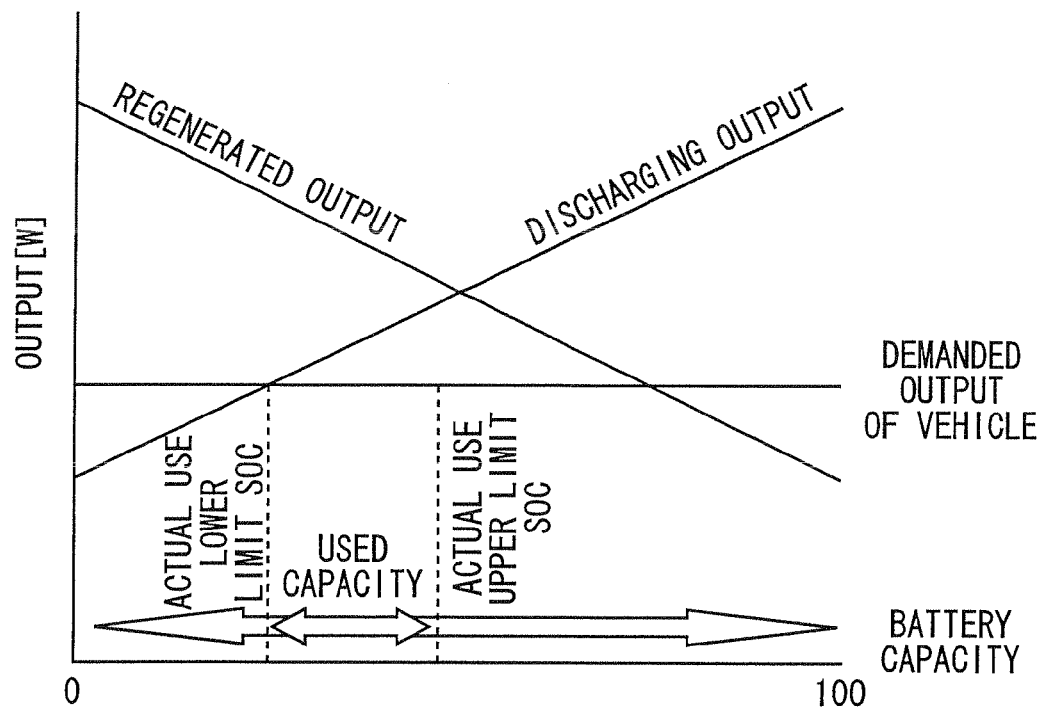
FIG. 16 is a diagram illustrating an example of the relationship (in the case of a new product) between the SOC of the capacitor according to the second embodiment of the present invention and the vehicle output thereof.
Figure 17:
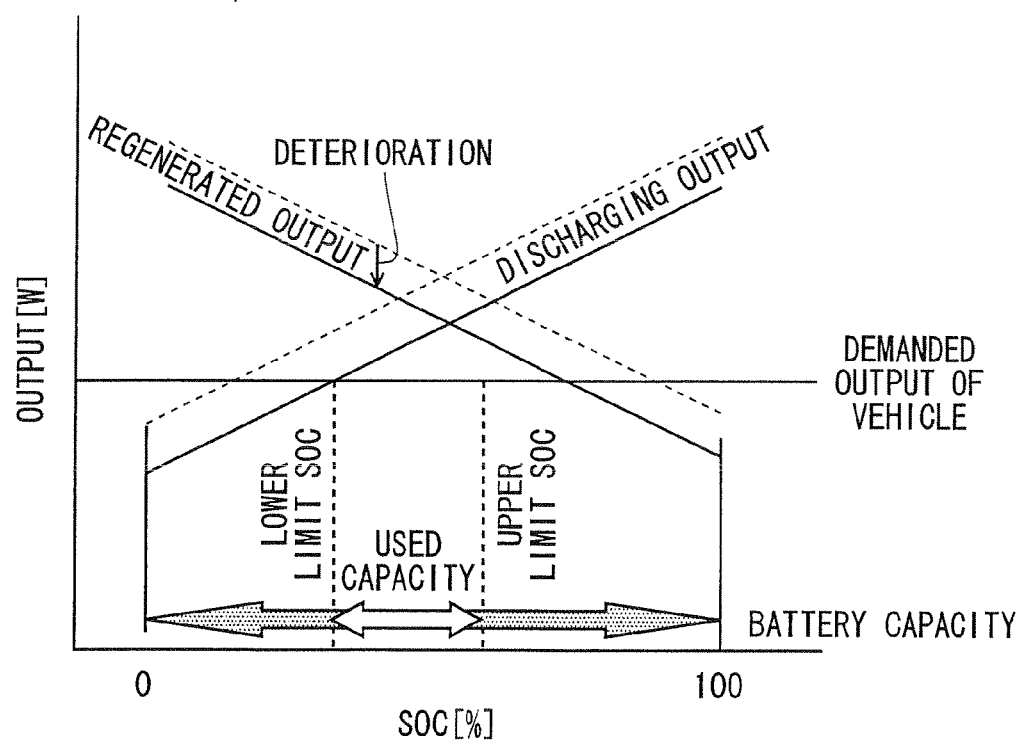
FIG. 17 is a diagram illustrating an example of the relationship (at the time of deterioration) between the SOC of the capacitor according to the second embodiment of the present invention and the vehicle output thereof.

FIGS. 16 and 17 are diagrams illustrating the relationship between the SOC and the output of the capacitor 201. As illustrated in FIG. 16, when the capacitor 201 is a new product, an SOC corresponding to the lower limit output that satisfies the demanded output of the vehicle is set as the actual use lower limit SOC. In addition, a value obtained by acquiring predetermined use capacity from the actual use lower limit SOC is finally set as the actual use upper limit SOC. In addition, as illustrated in FIG. 17, in a case where the capacitor 201 deteriorates in accordance with the use of the capacitor 201 for a predetermined period and cannot satisfy the demanded output of the vehicle, an SOC corresponding to the lower limit output that can satisfy the demanded output of the vehicle is set as the actual use lower limit SOC, and, at this time, a value obtained by acquiring a predetermined use capacity from the actual use lower limit SOC is finally set as the actual use upper limit SOC.

Figure 18:
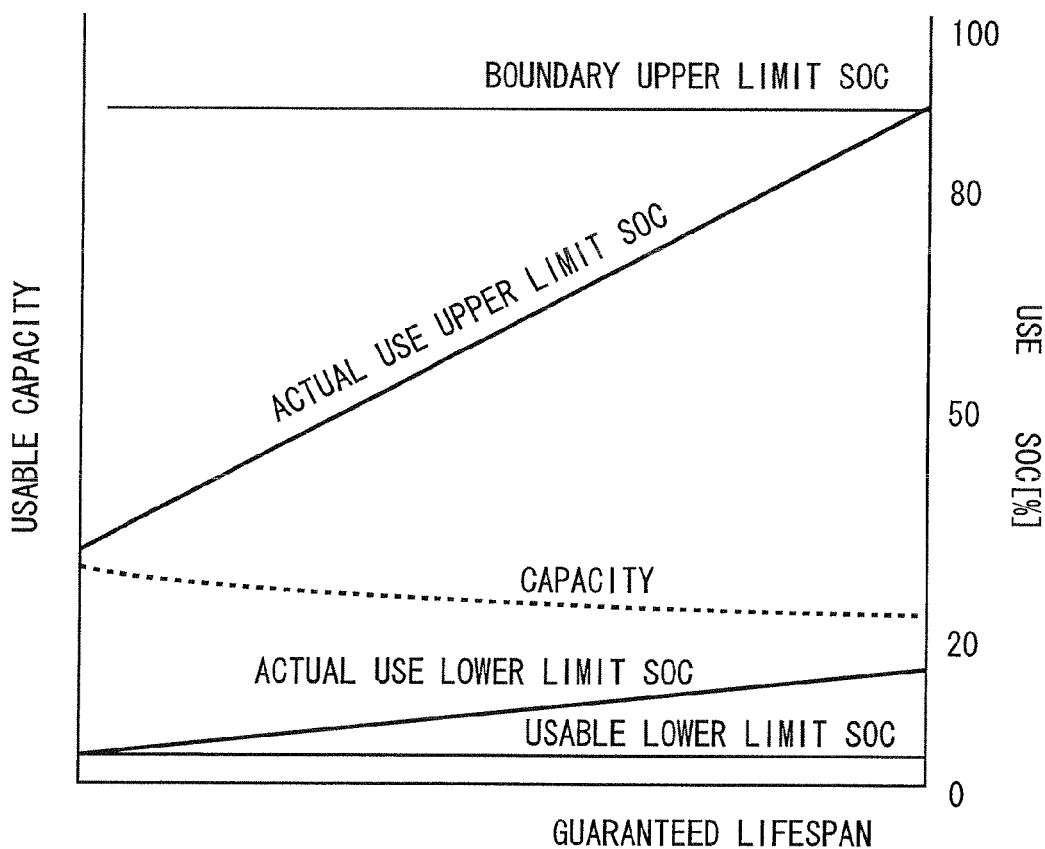
FIG. 18 is a diagram illustrating an example of the relationship among the usage period, each SOC, and the capacity of the capacitor according to the second embodiment of the present invention.
Figure 19:
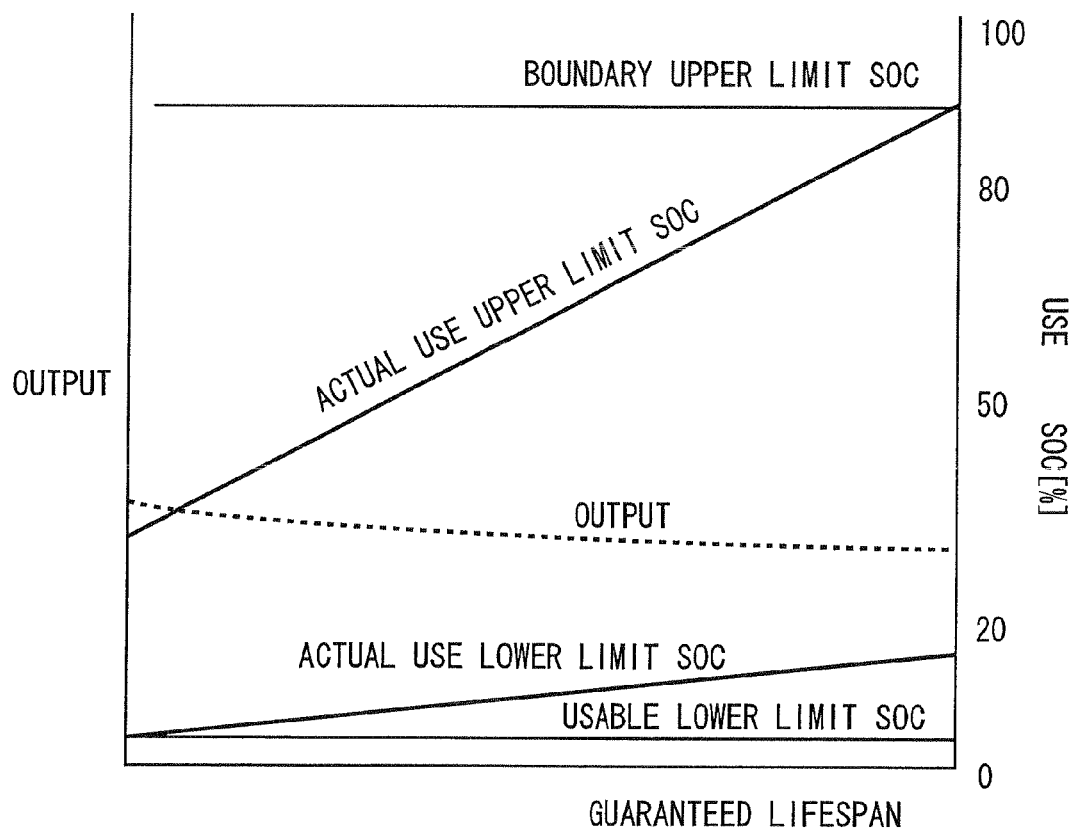
FIG. 19 is a diagram illustrating an example of the relationship among the usage period and each SOC of a capacitor according to the second embodiment of the present invention and the vehicle output thereof.

In addition, FIG. 18 is a diagram illustrating the relationship among the usage period, each SOC, and the capacity of the capacitor 201, and FIG. 19 is a diagram illustrating the relationship among the usage period, each SOC, the vehicle output, and the like of the capacitor 201. As illustrated in FIG. 18, it can be understood that the deterioration of the capacitor 201 hardly occurs until the guaranteed lifespan elapses from the initial usage period of the capacitor 201 by controlling the actual use upper limit SOC and the actual use lower limit SOC. In addition, as illustrated in FIG. 19, it can be understood that the vehicle output using the capacitor 201 hardly decreases until the guaranteed lifespan elapses from the initial usage period of the capacitor 201, by controlling the actual use upper limit SOC and the actual use lower limit SOC. At this time, the vehicle output (particularly, the maximum output) is higher than the demanded output of the vehicle.

Figure 20:
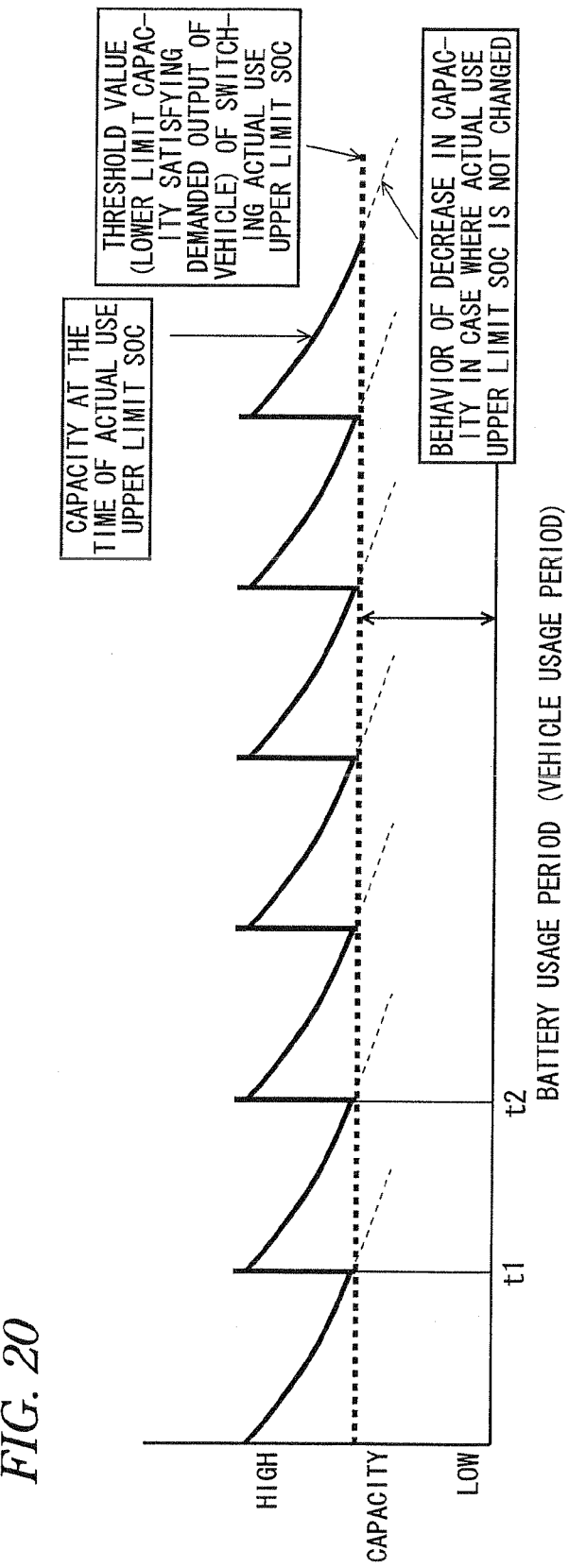
FIG. 20 is a diagram illustrating an example of the relationship between the period of use of the capacitor according to the second embodiment of the present invention and the capacity thereof at the actual use lower limit SOC.

Furthermore, FIG. 20 is a diagram illustrating an example of the relationship between the usage period of the capacitor and the capacity of the capacitor 201 at the actual use lower limit SOC. When the capacitor 201 is used to repeatedly charge the capacitor at the actual use lower limit SOC set at the first time several times, a capacity (the lower limit capacity at which the output does not satisfy the demanded output of the vehicle) that is equal to or greater than a predetermined switching threshold value cannot be acquired at time t11 as the capacity of the actual use lower limit SOC. At this time (time t11), the management ECU 217 updates the actual use lower limit SOC in the increasing direction. Then, when the capacitor 201 is used by repeatedly charging the capacitor at the updated actual use lower limit SOC several times, a capacity that is equal to or greater than the predetermined switching threshold value as the capacity of the updated actual use lower limit SOC cannot be acquired at time t12 again. At this time (time t12), the management ECU 217 updates the actual use lower limit SOC in the increasing direction again. As described above, when the switching threshold value cannot be acquired as the capacity at the actual use lower limit SOC, the management ECU 217 repeatedly updates the actual use lower limit SOC. In addition, when the update is performed at a short period, the variation in the capacity of the actual use lower limit SOC is small, and a rapid change in the behavior of the vehicle, for example, a driving distance for the EV driving without driving the ENG can be prevented.

By charging the capacitor 201 between the actual use lower limit OSC and the actual use upper limit SOC as described above by controlling the actual use upper limit SOC and the actual use lower limit SOC using the management ECU 217 as described above, the same capacity is used regardless of the usage period of the capacitor 201. Accordingly, even when the usable capacity of the capacitor is small from the start of the use of the capacitor 201, the ratio of the motor driving is the same as that at the time of a new product while satisfying the demanded output of the vehicle. Accordingly, a user does not get a feeling of strangeness. In addition, since the SOC use range of the capacitor is limited between the usable lower limit SOC and the actual use upper limit SOC in which only the target capacity (≤ usable capacity) is charged, it is possible to suppress the deterioration of the capacitor 201 due to the maintaining of the high SOC state.

Figure 21:
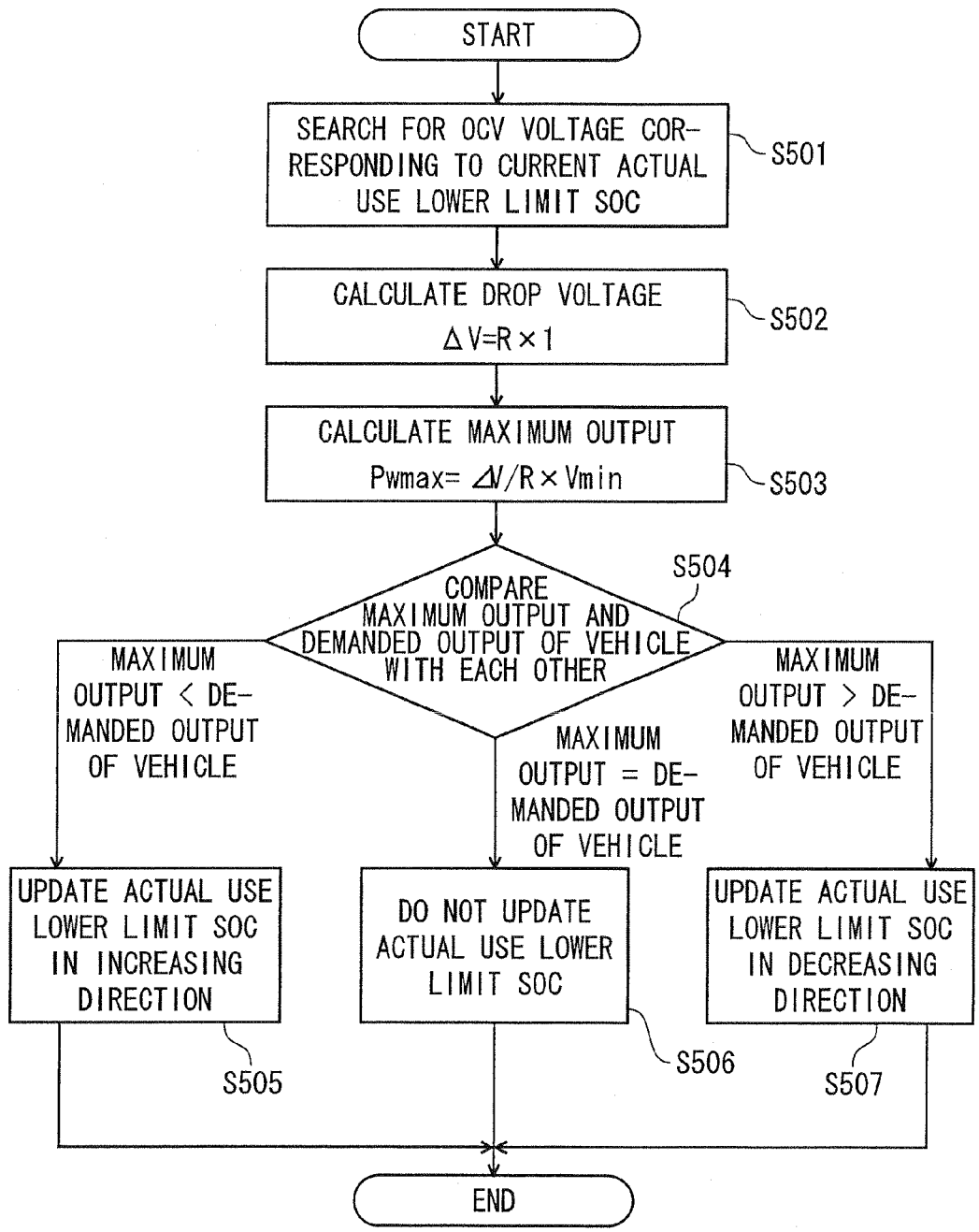
FIG. 21 is a flowchart illustrating an example of an operation for updating the actual use lower limit SOC according to the second embodiment of the present invention.

Next, an operation for updating the actual use lower limit SOC will be now described. FIG. 21 is a flowchart illustrating an example of an operation for updating the actual use lower limit SOC.

First, the management ECU 217 acquires an OCV voltage corresponding to the current actual use lower limit SOC by referring to the SOC-OCV table (Step S501).

Subsequently, the management ECU 217 calculates a dropped voltage (dropped voltage) ΔV=(internal resistance value) R×I (the charge/discharge current of the capacitor 201) (Step S502). This drop voltage ΔV represents the degree of variation (drop) in the capacitor 201 due to the charge/discharge current.

Subsequently, the management ECU 217 calculates a maximum output Pwmax (Step S503). In particular, Pwmax (maximum output)=ΔV (dropped voltage)/R (internal resistance)×Vmin (protection lower limit voltage). Here, the protection lower limit voltage is a lowest voltage of the capacitor 201 that is determined in advance so as to protect the capacitor 201. In addition, the maximum output is a vehicle output that can be output by dropping the voltage by ΔV and represents a maximum output that can be output in accordance with the current actual use lower limit SOC.

Subsequently, the management ECU 217 compares the maximum output and the demanded output of the vehicle (Step S504). In a case where the maximum output is lower than the demanded output of the vehicle, the actual use lower limit SOC is updated in the increasing direction (Step S505). In a case where the maximum output and the demanded output of the vehicle is the same, the actual use lower limit SOC is not updated (Step S506). On the other hand, in a case where the maximum output is higher than the demanded output of the vehicle, the actual use lower limit SOC is updated in the decreasing direction (Step S507).

Figure 22:
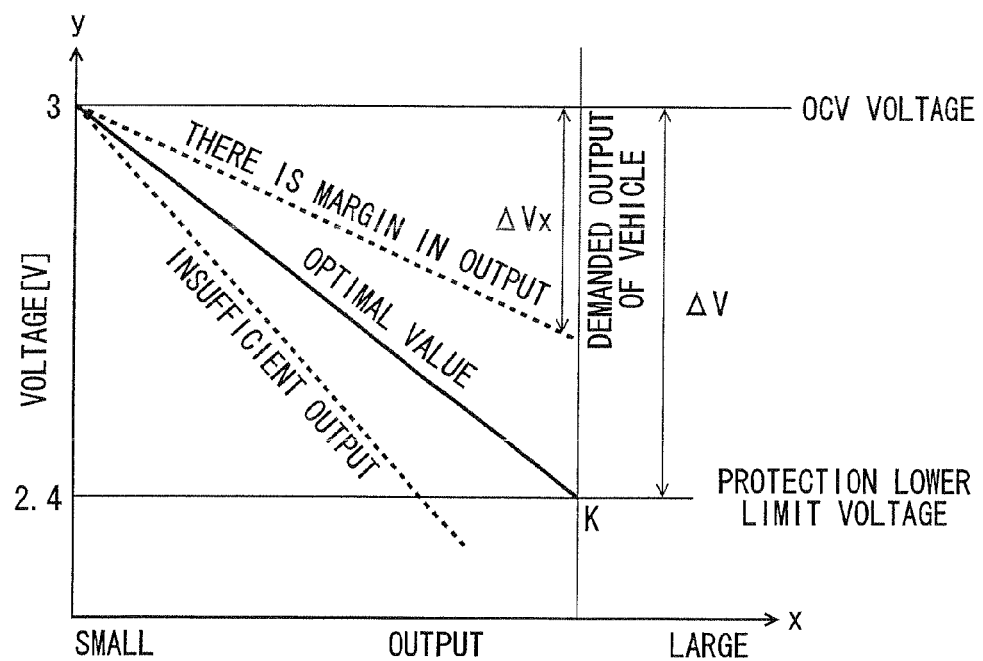
FIG. 22 is a diagram illustrating an example of the relationship among the open-circuit voltage, the protective lower limit voltage, and the vehicle request output corresponding to the actual use lower limit SOC according to the second embodiment of the present invention.

Here, FIG. 22 is a diagram illustrating an example of the relationship among the open-circuit voltage OCV, the protection lower limit voltage (Vmin), and the demanded output of the vehicle at the time when the SOC is the actual use lower limit SOC. In a case where the maximum output is equal to or less the demanded output of the vehicle, an output that satisfies the demanded output of the vehicle until the drop by a drop voltage ΔV from the open-circuit OCV at the time of the actual use lower limit SOC is formed. Thus, in this case, there is margin in the output. On the other hand, in a case where the maximum output is higher than the demanded output of the vehicle, the output does not satisfy the demanded output of the vehicle even in a case where the open-circuit voltage OCV at the time of the actual use lower limit SOC is dropped by the drop voltage ΔV, and the output is insufficient in this case. In addition, in a case where the maximum output is the same as the demanded output of the vehicle, an output that satisfies the demanded output of the vehicle is formed when the open-circuit voltage OCV at the time of the actual use lower limit SOC is dropped by the drop voltage ΔV.

Among the above-described cases, in the case where there is a room in the output or the case where the output is insufficient, the actual use lower limit SOC is updated with an SOC at which the demanded output of the vehicle is the maximum output. In addition, the actual use lower limit SOC may be updated based on the actual arrival voltage ΔVx that represents the dropped voltage at a time when the capacitor 201 performs output corresponding to the demanded output of the vehicle and a difference (predicted arrival voltage) ΔV between the open-circuit voltage OCV that is allowable for the capacitor 201 and the protection lower limit voltage Vmin. For example, when the deterioration state of the capacitor 201 is the same, the relationship between the output of the capacitor 101 and the voltage drop is understood that the slopes of the linear functions (the case where there is a margin in the output and the case where the output is insufficient) illustrated in FIG. 22 are the same. In this case, by correcting each linear function so as to pass through an intersection K of the line of the protection lower limit voltage and the line of the demanded output of the vehicle, the actual use lower limit SOC may be updated such that the intersection of the left end (Y axis) of the graph and the corrected linear function is the OCV voltage at the time of the actual use lower limit SOC.

Figure 24:
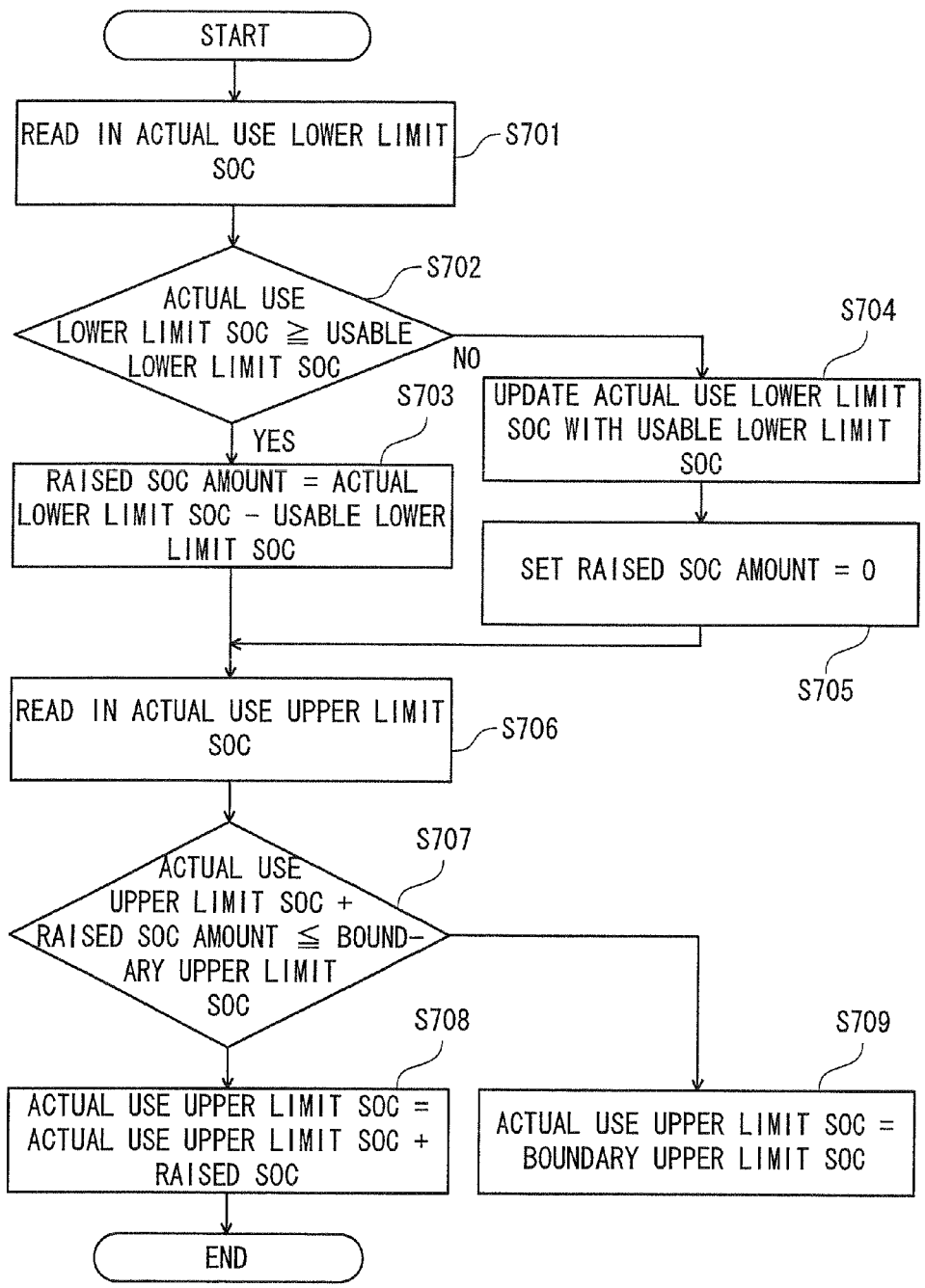
FIG. 24 is a flowchart illustrating an example of an operation for performing a second update of the actual use upper limit SOC according to the second embodiment of the present invention.

However, as illustrated in FIG. 24 (described later), in a case where the actual use lower limit SOC after update is below the usable lower limit SOC, the actual use lower limit SOC is finally updated so as to be the usable lower limit SOC. In addition, instead of updating the actual use lower limit SOC to be the OCV voltage, as described later with reference to FIG. 26, a value of the actual lower limit SOC after update may be determined based on the actual use upper limit SOC.

With this process illustrated in FIG. 21, by updating the actual use lower limit SOC in the increasing direction in a case where the maximum output corresponding to the actual use lower limit SOC is insufficient as the output, charging can be performed while satisfying the demanded output of the vehicle and suppressing the progress of deterioration of the capacitor. In addition, by updating the actual use lower limit SOC in the decreasing direction in a case where there is a margin in the maximum output corresponding to the actual use lower limit SOC, charging that is surplus for the capacitor 201 can be avoided, whereby a more environment-friendly vehicle can be provided.

Next, an operation for performing a first update of the actual use upper limit SOC according to this embodiment will be described.

Figure 23:
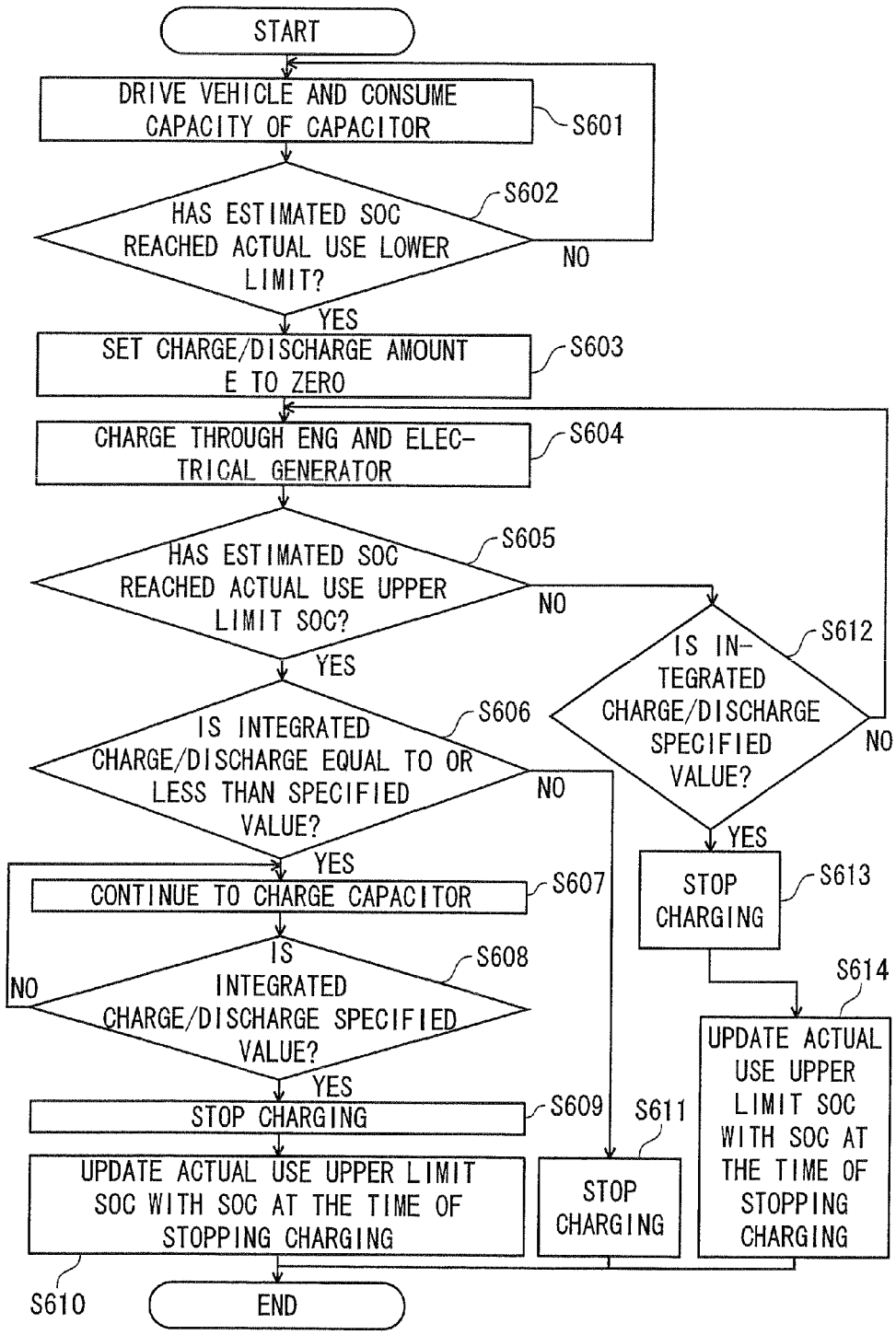
FIG. 23 is a flowchart illustrating an example of an operation for performing a first update of the actual use upper limit SOC according to the second embodiment of the present invention.

FIG. 23 is a flowchart illustrating an example of an operation for performing the first update of the actual use upper limit SOC according to this embodiment. In FIG. 23, it is assumed that charging is performed during driving the vehicle.

As the vehicle consumes the electric power through driving or the like, the capacity of the capacitor 201 is consumed (Step S601). The management ECU 217 determines whether or not the estimated SOC has arrived at the actual use lower limit SOC of the capacitor 201 though the consumption of the capacity (Step S602). In a case where the estimated SOC is determined to have arrived at the actual use lower limit SOC, the management ECU 217 resets the charge/discharge amount E, so that E=0 (Step S603). After the charge/discharge amount E is reset, calculation of the charge/discharge amount is started.

After the charge/discharge amount is reset, the generation of electricity using the internal combustion engine 207 and the electrical generator 209 is started based on an instruction of the management ECU 217, thereby starting to charge the capacitor 201 (Step S604). After the starting of the charging, the management ECU 217 determines whether the estimated SOC has arrives at the actual use upper limit SOC of the capacitor 201 (Step S605).

In a case where the estimated SOC is determined to have arrived at the actual use upper limit SOC, the management ECU 217 determines whether the calculated charge/discharge amount is equal to or less than a specified value (Step S606). In a case where the charge/discharge amount is determined to be larger than the specified value, the management ECU 217 performs control so as to stop charging the capacitor 201 (Step S611). In order to stop the charging, the generation of electricity using the internal combustion engine 207 and the electrical generator 209 is stopped based on an instruction of the management ECU 217, thereby stopping the charging the capacitor 201. In addition, the specified value compared with the charge/discharge amount is set in advance.

In a case where the charge/discharge amount is equal to or less than the specified value, the management ECU 217 performs control so as to continue to charge the capacitor 201 (Step S607) and determines whether or not the calculated charge/discharge amount has arrived at the specified value (Step S608). In a case where the calculated charge/discharge amount is determined not to have arrived at the specified value, the management ECU 217 performs control so as to continue to charge the capacitor 201.

In a case where the charge/discharge amount is determined to have arrived at the specified value, the management ECU 217 performs control so as to stop the charging of the capacitor (Step S609). Then, the management ECU 217 updates the actual use upper limit SOC of the capacitor 201 with the estimated SOC of the capacitor 201 at the time of stopping the charging (Step S610). Here, the actual use upper limit SOC is updated in the increasing direction.

On the other hand, in a case where the estimated SOC is determined not to have arrived at the actual use upper limit SOC in Step S605, the management ECU 217 determines whether or not the calculated charge/discharge amount has arrived at the specified value (Step S612). In a case where the charge/discharge amount is determined not to have arrived at the specified value, the process is returned back to Step S604, and the management ECU 217 performs control so as to continue to charge the capacitor 201.

In the case where the charge/discharge amount is determined to have arrived at the specified value, the management ECU 217 performs control so as to stop the charging of the capacitor 201 (Step S613). Then, the management ECU 217 updates the actual use upper limit SOC of the capacitor 201 with the estimated SOC of the capacitor 201 at the time of stopping the charging (Step S614). Here, the actual use upper limit SOC is updated in the decreasing direction.

With the process illustrated in FIG. 23, the capacitor can be charged while suppressing the progress of deterioration of the capacitor without giving a user a feeling of strangeness and performing unnecessary charging and discharging of the capacitor, thereby the life of the capacitor 201 can be lengthened.

In addition, it may be configured that the actual upper limit SOCs at time when the integrated charge/discharge amount is the specified value are accumulated as a plurality of samples in the process illustrated in FIG. 23, and the actual use upper limit SOC is updated with an optimal sample out of the plurality of samples. Here, although a case where the charging is performed using the internal combustion engine 207 and the electrical generator 209 during the driving of the vehicle is represented, a case where plug charge is performed may be considered.

Next, an operation for performing a second update of the actual use upper limit SOC according to this embodiment will be described.

FIG. 24 is a flowchart illustrating an example of an operation for performing the second update of the actual use upper limit SOC according to this embodiment. The process illustrated in FIG. 24 is performed after the process illustrated in FIG. 21 and the process illustrated in FIG. 23.

Figure 25:
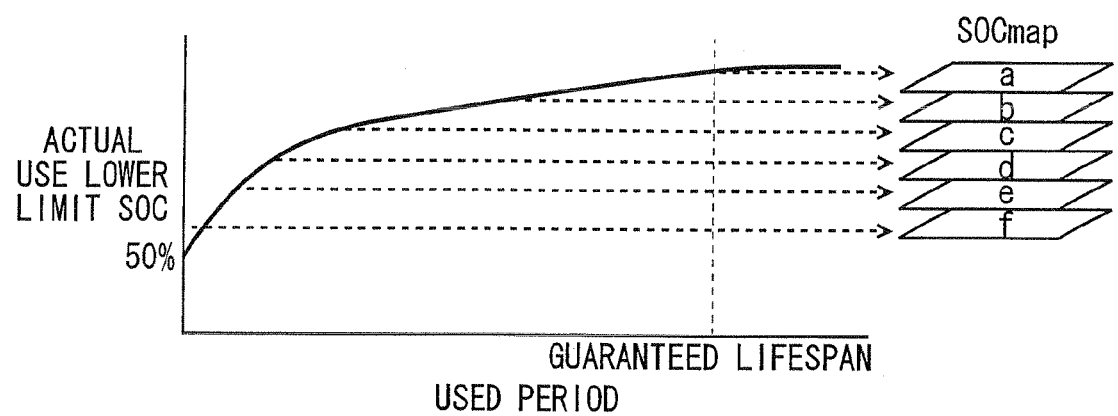
FIG. 25 is a diagram illustrating an example that represents the relationship between the actual use lower limit SOC and the SOC map according to the second embodiment of the present invention.

First, the management ECU 217 reads in the actual use lower limit SOC (Step S701). Here, the reading in the actual use lower limit SOC is acquiring the actual use lower limit SOC acquired in FIG. 21 (real-time acquisition) or acquiring the actual use lower limit SOC from the SOCmap. Here, in the SOCmap, control information used for forming the SOC of the capacitor 201 as a predetermined value is included, and the SOCmap is maintained in a memory unit (not shown) in advance. In a case of using the SOCmap, when the update value of the actual use lower limit SOC is determined, the management ECU 217 replaces the actual use lower limit SOC with the SOCmap corresponding to the update value. FIG. 25 is a diagram illustrating an example that represents the relationship between the actual use lower limit SOC and the SOCmap. In FIG. 25, six a to f are represented as the SOCmap, and it is represented that the actual use lower limit SOC of b is higher than that of c, and the actual use lower limit SOC of a is higher than that of b. For example, as illustrated in FIG. 25, in a case where the deterioration of the capacitor 201 progresses as the usage period increases, the SOCmap is replaced with a higher SOC. When the case of the real-time acquisition and the case of acquisition through the SOCmap are compared with each other, the actual use lower limit SOC on which the latest information is constantly reflected can be acquired in the case of the real-time acquisition.

Subsequently, the management ECU 217 determines whether or not the read actual use lower limit SOC is equal to or higher than the usable SOC (Step S702). In a case where the actual use lower limit SOC is equal to or higher than the usable lower limit SOC value, the management ECU 217 sets the raising amount of the actual use upper limit SOC as a difference between the actual use lower limit SOC and the usable lower limit SOC (Step S703). On the other hand, in a case where the actual use lower limit SOC is less than the usable SOC value, the management ECU 217 updates the actual use lower limit SOC with the value of the usable lower limit SOC (Step S704) and set the raising amount of the actual use upper limit SOC to zero (in other words, the actual use upper limit SOC is not raised) (Step S705).

Subsequently, the management ECU 217 reads in the actual use upper limit SOC (Step S706). Here, the reading in the actual use upper limit SOC is acquiring the actual use upper limit SOC acquired in FIG. 23 (real-time acquisition) or acquiring the actual use upper limit SOC from the SOCmap. Here, in the SOCmap, information that is similar to the SOCmap used for the actual use lower limit SOC is included, and the information is applied to the actual use upper limit SOC.

Subsequently, the management ECU 217 determines whether or not a value obtained by adding the raising amount (that is, the update amount of the actual use lower limit SOC) represented in Step S703 or S705 to the read actual use upper limit SOC is equal to or lower than the boundary upper limit SOC (Step S707). In a case where the value is equal to or lower than the boundary upper limit SOC, the management ECU 217 updates the actual use upper limit SOC with a sum of the actual use upper limit SOC and the raising amount (Step S708). On the other hand, in a case where the value is higher than the boundary upper limit SOC, the management ECU 217 updates the actual use upper limit SOC with the value of the boundary upper limit SOC (Step S709).

With the process shown in FIG. 24, the actual use upper limit SOC and the actual use lower limit SOC are reliably controlled between the boundary upper limit SOC and the usable lower limit SOC. Accordingly, the charging of the capacitor 201 can be securely performed, whereby an area affecting the life of the battery can be avoided. In addition, the update amount of the second update of the actual use upper limit SOC is determined in correspondence with the update amount of the actual use lower limit SOC, the same capacity and the maximum output can be constantly acquired, and there is no case where a user gets a feeling of strangeness. Furthermore, as the life of the battery is lengthened, the number of the batteries to be mounted in the capacitor 201 can be decreased.

Next, update of the actual use lower limit SOC based on the actual use upper limit SOC will be described.

In the process illustrated in FIG. 21, although the value of the actual use lower limit SOC after update is determined based on the relationship between the maximum output and the demanded output of the vehicle, the value of the actual use lower SOC after update may be determined based on the actual use upper limit SOC.

Figure 26:
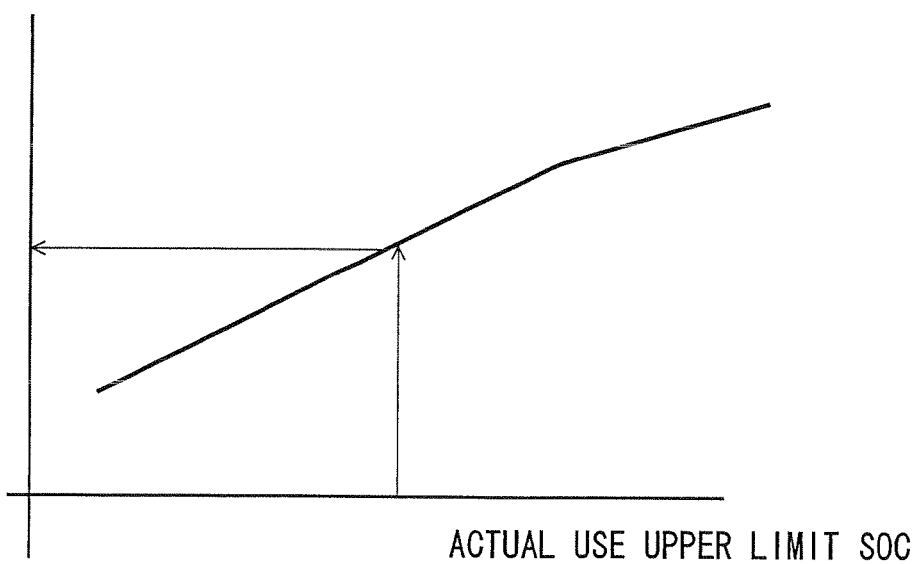
FIG. 26 is a diagram illustrating an example of an actual use upper limit SOC—actual use lower limit SOC table according to the second embodiment of the present invention.
Figure 27:
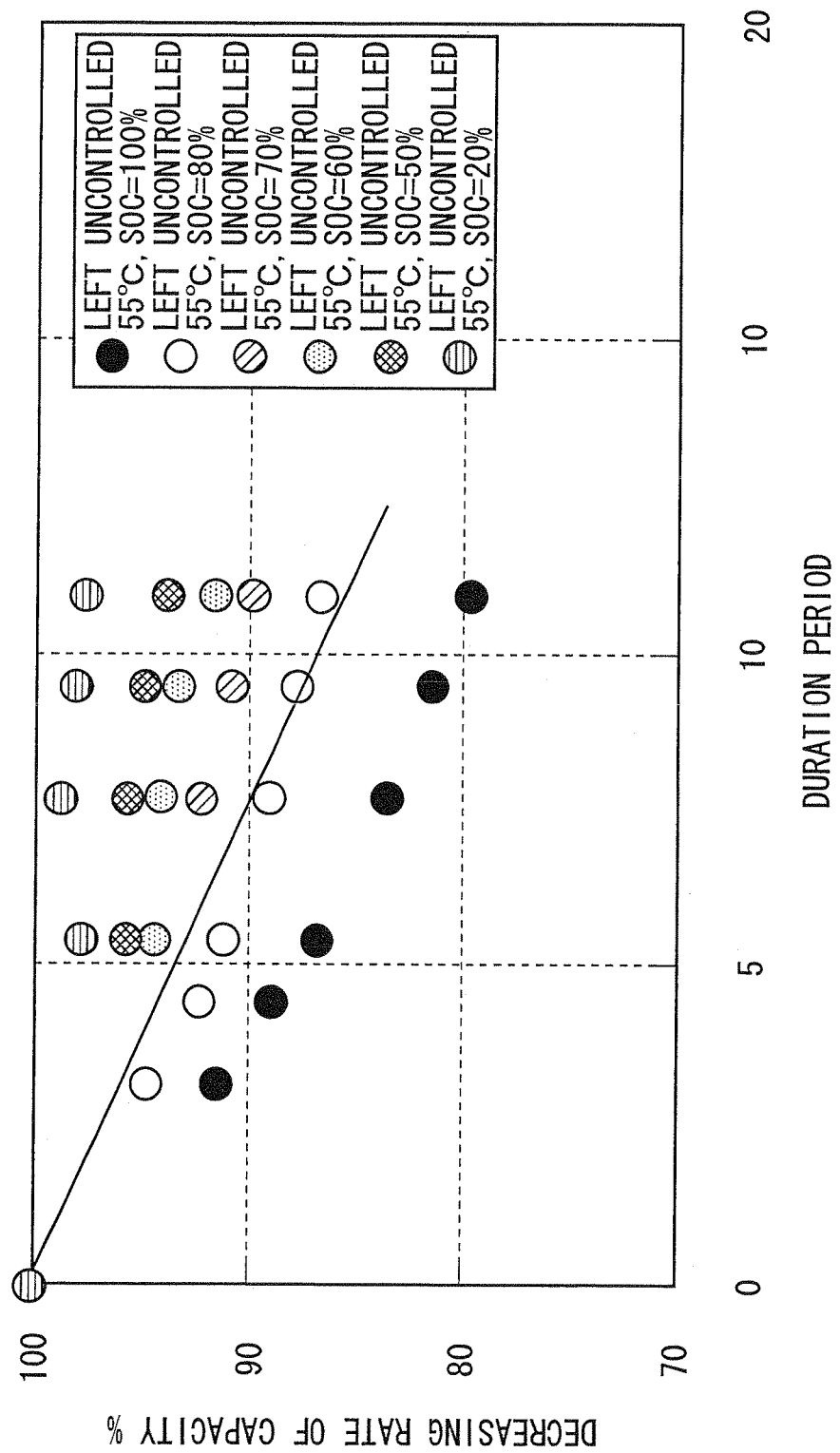
FIG. 27 is a diagram illustrating an example of the relationship between the duration days and a capacity decreasing rate of the capacitor.
Figure 28:
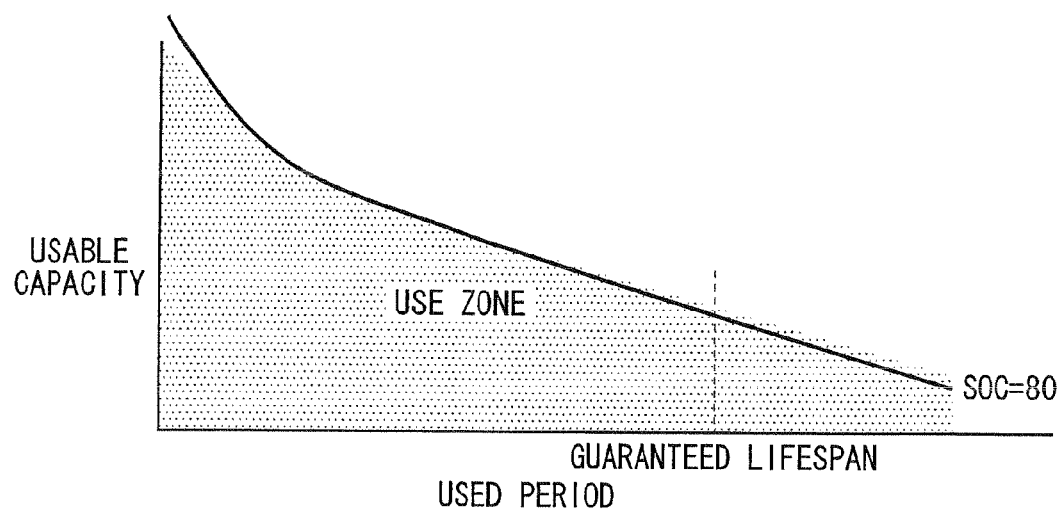
FIG. 28 is a diagram illustrating an example of the relationship between the usage period and the usable capacity of a conventional capacitor.

FIG. 26 represents an actual use upper limit SOC—actual use lower SOC table, and the table is maintained in a memory unit (not shown). Although the first update is performed for the actual use upper limit SOC through the process illustrated in FIG. 23, there is a possibility that the capacity between the actual use upper limit SOC and the actual use lower limit SOC may be larger or smaller than the target capacity through the first update. Accordingly, in this actual use upper limit—actual use lower limit SOC table, the actual use upper limit SOC and the actual use lower limit SOC have one-to-one correspondence, so that a capacity between the actual use upper limit SOC and the actual use lower limit SOC is the target capacity.

The management ECU 217 determines the value of the actual use lower limit SOC after update based on the update amount of actual use upper limit SOC by referring to the actual use upper limit SOC—actual use lower limit SOC table illustrated in FIG. 26. For example, the amount of the actual use upper limit SOC that is the same as the amount of the raising amount of the actual use upper limit SOC is updated. Accordingly, since the target capacity can be maintained to be constant without performing a special process, the charging can be performed while suppressing the progress of deterioration of the capacitor. At this time, the value of the actual use lower limit SOC after update is controlled not to be below the usable lower limit SOC. For example, in a case where it is predicted that the value of the actual use lower limit SOC after update is below the usable lower limit SOC, the value of the usable lower limit SOC is updated as the actual use lower limit SOC.

In this embodiment, the management ECU 217 may update the actual use lower limit SOC based on the temperature detected by the temperature sensor 231.

In addition, in this embodiment, the content (charging, SOC control, or the like) processed by the management ECU 217 may be processed by the battery ECU 223.

In this embodiment, although an HEV has been used for the description, the present invention can be also applied to a different type of electrically powered vehicle such as an EV (Electric Vehicle), a PHEV (Plugin Hybrid Electrical Vehicle), an FCV (Fuel Cell Vehicle), a PFCV (Plugin Fuel Cell Vehicle), or the like.

Although the present invention has been described in detail by referring to specific embodiments, it is apparent to those skilled in the art that various changes or modifications may be applied thereto without departing from the spirit and the scope of the present invention.

This application is based on Japanese Patent Application No. 2008-298216 filed on Nov. 21, 2008 and Japanese Patent Application No. 2009-064381 filed on Mar. 17, 2009, and the entire contents of which are incorporated herein by reference.

INDUSTRIAL APPLICABILITY

The present invention is useful for a charge controller capable of charging a capacitor while suppressing the progress of deterioration of the capacitor without performing unnecessary charging and discharging of the capacitor and the like.

In addition, the present invention is useful for a charge controller capable of charging a capacitor while suppressing the progress of deterioration of the capacitor and satisfying the demanded output of the vehicle and the like.

DESCRIPTION OF REFERENCE NUMERALS AND SIGNS

101: battery (BATT)
103: first inverter (FIRST INV)
105: electrical motor (MOT)
107: internal combustion engine (ENG)
109: electrical generator (GEN)
111: second inverter (Second INV)
115: gear
117: management ECU (MG ECU)
119: motor ECU (MOT ECU)
121: engine ECU (ENG ECU)
123: battery ECU (BATT ECU)
127: drive shaft
129: drive wheel
131: temperature sensor
133: voltage sensor
135: current sensor
137: charger
139: external power supply source
201: capacitor (BATT)
203: first inverter (First INV)
205: electrical motor (MOT)
207: internal combustion engine (ENG)
208: electrical generator (GEN)
209: second inverter (Second INV)
211: second inverter (Second INV)
215: gear
217: management ECU (MG ECU)
219: motor ECU (MOT ECU)
221: engine ECU (ENG ECU)
223: battery ECU (BATT ECU)
227: drive shaft
229: drive wheel
231: temperature sensor
233: voltage sensor
235: current sensor
237: charger
239: external power supply source

The invention claimed is:

1. A charge controller for a chargeable capacitor, comprising:
   a voltage detector that detects a voltage of the capacitor;
   a current detector that detects a charge/discharge current of the capacitor;
   a charge capacity estimating unit that estimates a charge capacity of the capacitor based on the voltage;
   a charge/discharge amount calculator that calculates a charge/discharge amount of the capacitor from start of charging the capacitor by integrating the charge/discharge current; and a charge controller that controls charging of the capacitor based on the charge capacity of the capacitor and the charge/discharge amount of the capacitor, wherein the charge controller updates the charge capacity and sets the updated charge capacity to actual use upper limit charge capacity based on a state characteristic of the capacitor.

2. The charge controller according to claim 1, wherein the charge controller updates the charge capacity and sets the updated charge capacity to the actual use upper limit charge capacity when the charge/discharge amount reaches a predetermined value in charging the capacitor.

3. The charge controller according to claim 2, wherein the charge controller controls charging of the capacitor in a first charge mode, wherein in the first charge mode, the charge capacity at a time when the charge/discharge amount reaches the predetermined value from a time when the charge capacity is a usable lower limit charge capacity is set as the actual use upper limit charge capacity in charging the capacitor.

4. The charge controller according to claim 3, wherein the charge controller controls the charging of the capacitor until the charge/discharge amount reaches the predetermined value even if the charge capacity reaches the actual use upper limit charge capacity.

5. The charge controller according to claim 3, wherein the charge controller causes the charging of the capacitor to be stopped when the charge capacity does not reach the actual use upper limit charge capacity but the charge/discharge amount reaches the predetermined value.

6. The charge controller according to claim 3, further comprising:

a memory unit that stores therein the charge capacity therein whenever the charge/discharge amount reaches the predetermined value, wherein the charge controller sets the updated charge capacity to the actual use upper limit charge capacity based on the charge capacity.

7. The charge controller according to claim 6, wherein the memory unit stores the estimated charge capacity corresponding to a predetermined number therein whenever the charge/discharge amount reaches the predetermined value.

8. The charge controller according to claim 6, wherein the memory unit stores therein the estimated charge capacity corresponding to a predetermined number whenever the charge/discharge amount reaches the predetermined value during a predetermined time interval.

9. The charge controller according to claim 2, wherein the charge controller controls charging of the capacitor in a second charge mode when the charging of the capacitor is started such that the charge capacity is higher than a usable lower limit charge capacity, wherein, in the second charge mode, the charge controller estimates a remaining amount of the capacitor at the time of starting the charging based on the actual use upper limit charge capacity, the usable lower limit charge capacity, the charge capacity, and the predetermined value at the time of the starting of the charging, and wherein the charge controller estimates the remaining amount in the charge/discharge amount in charging the capacitor.

10. The charge controller according to claim 9, wherein the charge controller controls charging of the capacitor in the second charge mode when the capacitor is connected to an external power source provided outside a vehicle mounted with the capacitor, and wherein the remaining amount is estimated as $(X-C)/(B-C) \times A$, where the actual use upper limit charge capacity is B, the usable lower limit charge capacity is C, the charge capacity is X, and the predetermined value is A at the time of connecting the capacitor to the external power source.

11. The charge controller according to claim 2, wherein a boundary upper limit charge capacity is initialized, and wherein the charge controller estimates a malfunction in the capacitor and notifies a notification unit of the malfunction if the actual use upper limit charge capacity exceeds the boundary upper limit charge capacity.

12. The charge controller according to claim 1, further comprising:

an internal resistance estimating unit that estimates internal resistance of the capacitor, wherein the charge controller, based on the internal resistance, sets a value that is larger than the usable lower limit charge capacity and equal to or less than the boundary upper limit charge capacity and satisfies a demanded output of the vehicle, as the actual use lower limit charge capacity, and wherein the charge controller controls the charging of the capacitor such that the charge capacity is equal to or higher than the actual use lower limit charge capacity.

13. The charge controller according to claim 12, wherein the charge controller sets a value that is larger than the actual use lower limit charge capacity and is equal to or less than the boundary upper limit charge capacity, as an actual use upper limit charge capacity, and wherein the charge controller controls the charging of the capacitor between the actual use lower limit charge capacity and the actual use upper limit charge capacity.

14. The charge controller according to claim 12, wherein the charge controller, if when a maximum output when the charge capacity is the actual use lower limit charge capacity is different from the demanded output of the vehicle, updates the actual use lower limit charge capacity with the charge capacity at which the demanded output of the vehicle is the maximum output.

15. The charge controller according to claim 14, wherein the charge controller, if the maximum output at the time when the charge capacity is the actual use lower limit charge capacity does not satisfy the demanded output of the vehicle, updates the actual use lower limit charge capacity with the charge capacity at which the demanded output of the vehicle is the maximum output.

16. The charge controller according to claim 14, wherein the charge controller, if the maximum output at the time when the charge capacity is the actual use lower limit charge capacity is higher than the demanded output of the vehicle, updates the actual use lower limit charge capacity with the charge capacity at which the demanded output of the vehicle is the maximum output.

17. The charge controller according to claim 12, further comprising:

a memory unit that stores therein first information that associates the charge capacity of the capacitor with an open-circuit voltage of the capacitor, wherein the charge controller estimates the open-circuit voltage at a time when the charge capacity is the actual use lower limit charge capacity based on the first information and updates the actual use lower limit charge capacity based on an actual arrival voltage that represents a dropped voltage at a time when the capacitor performs output corresponding to the demanded output of the vehicle and a predicted arrival voltage that represents a difference between the estimated open-circuit voltage and a predetermined protection lower limit voltage that is used for protecting the capacitor.

18. The charge controller according to claim 12, further comprising:
a temperature detector that detects temperature of the capacitor,
wherein the charge controller updates the actual use lower limit charge capacity based on the temperature.

19. The charge controller according to claim 13,
wherein the charge controller updates the actual use upper limit charge capacity based on an update amount of the actual use lower limit charge capacity.

20. The charge controller according to claim 13, further comprising:
a memory unit that stores therein second information associating the actual use lower limit charge capacity with the actual use upper limit charge capacity,
wherein the charge controller refers to the second information and updates the actual use lower limit charge capacity based on the update amount of the actual use upper limit charge capacity.

* * * * *